United States Patent
Kim et al.

(10) Patent No.: US 10,216,230 B2
(45) Date of Patent: Feb. 26, 2019

(54) WINDOW SUBSTRATE AND DISPLAY DEVICE HAVING THE SAME

(71) Applicant: SAMSUNG DISPLAY CO., LTD., Yongin-si, Gyeonggi-Do (KR)

(72) Inventors: Myung Hwan Kim, Yongin-si (KR); Ik Hyung Park, Yongin-si (KR); Seong Jin Hwang, Yongin-si (KR); Sung Chul Kim, Yongin-si (KR); Jang Doo Lee, Yongin-si (KR); Jong Hyuk Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/625,407

(22) Filed: Jun. 16, 2017

(65) Prior Publication Data

US 2018/0046220 A1    Feb. 15, 2018

(30) Foreign Application Priority Data

Aug. 10, 2016  (KR) .................. 10-2016-0102066

(51) Int. Cl.
| | | |
|---|---|---|
| *H01L 21/76* | (2006.01) | |
| *G06F 1/16* | (2006.01) | |
| *H01L 23/498* | (2006.01) | |
| *H01L 27/32* | (2006.01) | |
| *H01L 51/00* | (2006.01) | |
| *H05K 5/00* | (2006.01) | |

(52) U.S. Cl.
CPC ........ *G06F 1/1652* (2013.01); *H01L 23/4985* (2013.01); *H01L 27/32* (2013.01); *H01L 51/0097* (2013.01); *H05K 5/0017* (2013.01); *H01L 2251/5338* (2013.01)

(58) Field of Classification Search
CPC . H01L 23/4985; H01L 27/32; H01L 51/0097; G06F 1/1652; H05K 5/0017
USPC .......................................................... 438/406
See application file for complete search history.

(56) References Cited

U.S. PATENT DOCUMENTS

| | | | |
|---|---|---|---|
| 9,321,677 B2 | 4/2016 | Chang et al. | |
| 9,321,678 B2 | 4/2016 | Chang et al. | |
| 9,321,679 B2 | 4/2016 | Chang et al. | |
| 9,647,128 B2 * | 5/2017 | Yamazaki | ........... H01L 29/7869 |
| 9,766,517 B2 * | 9/2017 | Kimura | ............... G02F 1/13454 |
| 9,780,121 B2 * | 10/2017 | Watanabe | ............. H01L 27/124 |
| 2013/0209751 A1 | 8/2013 | Zhang et al. | |
| 2016/0002103 A1 | 1/2016 | Wang et al. | |
| 2016/0200630 A1 * | 7/2016 | Amano | ..................... B05D 7/02 |
| | | | 216/87 |

(Continued)

FOREIGN PATENT DOCUMENTS

| | | |
|---|---|---|
| JP | 2013-528561 | 7/2013 |
| KR | 10-1238214 | 3/2013 |
| KR | 10-2015-0119408 | 10/2015 |

*Primary Examiner* — David S Blum

(74) *Attorney, Agent, or Firm* — F. Chau & Associates, LLC

(57) ABSTRACT

A window substrate includes a glass substrate including first and second surfaces opposite to each other, the glass substrate having a thickness of about 25 μm to about 100 μm, and a coating layer disposed on the first surface. The glass substrate includes $SiO_2$, $Al_2O_3$ and $Na_2O$, and the mole ratio of $Al_2O_3/Na_2O$ is equal to or smaller than 1.

37 Claims, 21 Drawing Sheets

(56) References Cited

U.S. PATENT DOCUMENTS

2017/0350991 A1* 12/2017 Friedman .............. G01T 1/2935
2017/0352841 A1* 12/2017 Lee .................... H01L 51/5268
2017/0358776 A1* 12/2017 Youn .................. H01L 51/5268

* cited by examiner

WINDOW SUBSTRATE AND DISPLAY DEVICE HAVING THE SAME

CROSS-REFERENCE TO RELATED APPLICATION

The present application claims priority under 35 U.S.C. § 119 to Korean Patent Application No. 10-2016-0102066, filed on Aug. 10, 2016, in the Korean Intellectual Property Office, the disclosure of which is incorporated by reference herein in its entirety.

TECHNICAL FIELD

The present invention relates to a window substrate and a display device having the same.

DISCUSSION OF THE RELATED ART

Recently, flexible display devices using flat panel display devices have been developed. The flat panel display devices generally include a liquid crystal display (LCD), an organic light emitting diode (OLED) display, an electrophoretic display (EPD), or the like.

The flexible display devices can be folded or rolled due to their flexibility. Accordingly, the flexible display devices that have large screens can be conveniently carried. The flexible display devices can be applied in various fields including not only mobile equipment such as mobile phones, portable multimedia players (PMPs), navigations, ultra mobile PCs (UMPCs), electronic books, and electronic newspapers, but also televisions (TVs), monitors, and other electronic devices that utilize display devices.

SUMMARY

Exemplary embodiments of the present invention relate to a high-quality window substrate.

Exemplary embodiments of the present invention relate to a display device having a window substrate.

According to an exemplary embodiment of the present invention, a window substrate includes a glass substrate including first and second surfaces opposite to each other, the glass substrate having a thickness of about 25 µm to about 100 µm, and a coating layer disposed on the first surface. The glass substrate includes $SiO_2$, $Al_2O_3$ and $Na_2O$, and the mole ratio of $Al_2O_3/Na_2O$ is equal to or smaller than 1.

According to an exemplary embodiment of the present invention, a display device includes a display panel displaying an image on a first surface thereof, and a window substrate disposed on the first surface of the display panel. The window substrate includes a glass substrate including first and second surfaces opposite to each other, the glass substrate having a thickness of about 25 µm to about 100 µm, and a coating layer disposed on the first surface of the glass substrate, wherein the coating layer has a thickness equal to or smaller than about 10 µm, and the coating layer is disposed between the glass substrate and the display panel. The glass substrate includes $SiO_2$, $Al_2O_3$ and $Na_2O$, and the mole ratio of $Al_2O_3/Na_2O$ is equal to or smaller than 1.

According to an exemplary embodiment of the present invention, a display device includes a display panel having a first surface for display of an image, a flexible glass substrate having a thickness of about 25 µm to about 100 µm and disposed on the first surface of the display panel, the flexible glass surface having a first reinforced surface and a second reinforced surface opposite to the first reinforced surface, the first reinforced surface overlapping the first surface of the display panel, and a coating layer disposed between the display panel and the glass substrate. The flexible glass substrate has a reaction against bending of 1 unit force, and the flexible glass substrate and the coating layer, when directly disposed on one another, have a reaction against bending greater than 1 unit of force and smaller than or equal to 1.5 units of force.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION

Figure 1:
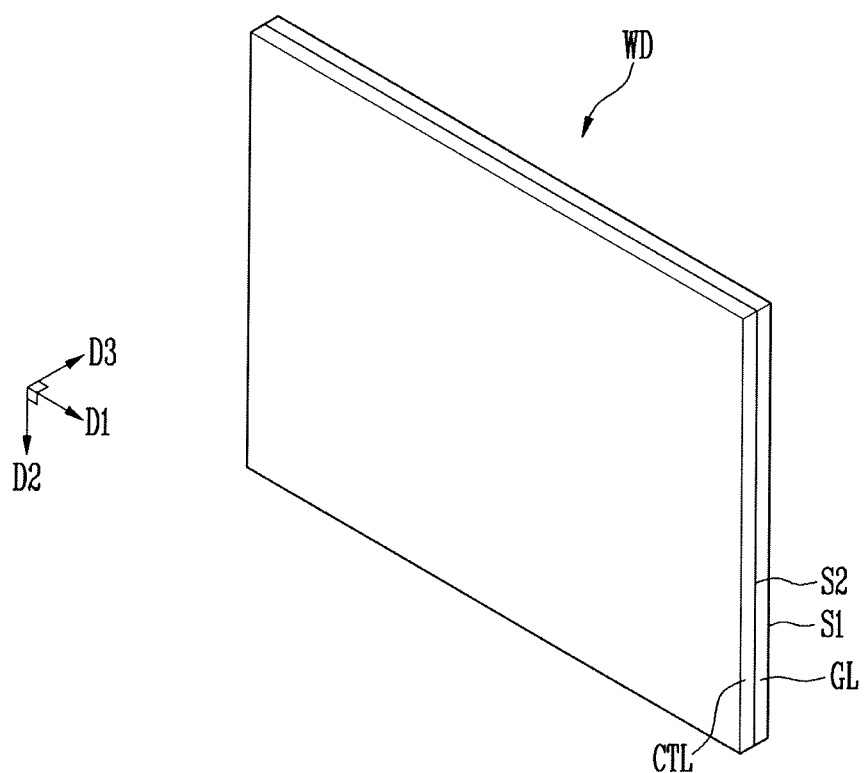
FIG. 1 is a perspective view illustrating a window substrate according to an exemplary embodiment of the present invention.

Exemplary embodiments of the present invention will now be described more fully hereinafter with reference to the accompanying drawings. The present invention may, however, be embodied in different forms and should not be construed as limited to the embodiments set forth herein. In the drawings, the sizes of elements, layers and regions may be exaggerated for clarity.

Like reference numerals may refer to like elements throughout the specification. As used herein, when referring to an element in the singular form, the singular form may include the plural forms as well, unless the context clearly indicates otherwise.

An exemplary embodiment of the present invention relates to a window substrate including a glass substrate. The window substrate can be employed in a display device. For example, the window substrate can be used as a window panel, located on a front surface of a display panel. Accordingly, in exemplary embodiments of the present invention, the window panel may be referred to as a window substrate. However, "window substrate" may also refer to a transparent insulating substrate. For example, the window substrate may be used as a base substrate on which elements are mounted in a display device or a counter substrate opposite to the base substrate. In addition, the window substrate may be used as a substrate of a touch screen panel, provided on a display substrate.

FIG. 1 is a perspective view illustrating a window substrate according to an exemplary embodiment of the present invention.

Referring to FIG. 1, a window substrate WD according to an embodiment of the present invention, includes a glass substrate GL and a coating layer CTL disposed on a surface of the glass substrate GL.

In an embodiment of the present invention, for convenience of description, it is assumed that the shape of the window substrate WD, on a plane, is rectangular, having a pair of long sides and a pair of short sides. In addition, for convenience of description, the long sides of the window substrate WD extend in a first direction D1, and the short sides of the window substrate WD extend in a second direction D2, as shown in FIG. 1. The first direction D1 is perpendicular to the second direction D2, and a third direction D3 is perpendicular to the first and second directions D1 and D2. However, the shape of the window substrate WD is not limited to the example given above, and the window substrate WD may have various shapes. For example, the window substrate WD may have various shapes such as a closed-shape polygon including linear sides, a circle, an ellipse, etc., including curved sides, a semicircle, a semi-ellipse, etc., including linear and curved sides, or a combination thereof. In an exemplary embodiment of the present invention, when the window substrate WD has linear sides, one or more corners of the window substrate WD may be curved. For example, when the window substrate WD has a rectangular shape, an area where intersecting linear sides of the window substrate WD meet may be replaced with a curve having a predetermined curvature. In other words, a vertex portion of the rectangular window substrate WD may be rounded and may have a predetermined curvature. The curvature may be set or changed depending on the shape of the window substrate WD. For example, the curvature may be changed depending on a position at which the curve is started, a length of the curve, etc.

The glass substrate GL may be provided in the shape of a plate having a first surface S1 and a second surface S2 opposite to the first surface S1. The distance between the first surface S and the second surface S2 is defined as the thickness of the glass substrate GL. The thickness of the glass substrate GL may be measured, for example, in the third direction D3.

The glass substrate GL may include a glass material including a silicate. In an exemplary embodiment of the present invention, various materials may be further added to the glass material to have excellent durability, surface smoothness, and transparency. For example, the glass substrate GL may include a material including an aluminosilicate, borosilicate, boroaluminosilicate, etc. In an exemplary embodiment of the present invention, the glass substrate GL may further include an alkali metal or an alkali earth metal and/or an oxide thereof.

In an exemplary embodiment of the present invention, the glass material may include $Al_2O_3$, $Na_2O$, and $SiO_2$. In an exemplary embodiment of the present invention, the glass material may include $B_2O_3$, $MgO$, $CaO$, $BaO$, $SnO_2$, $ZrO_2$, $Na_2O$, $SrO$, and the like, in addition to $Al_2O_3$, $Na_2O$, and $SiO_2$. Among the materials included in the glass material, the $Al_2O_3$, $Na_2O$, and $SiO_2$ may be contained with various composition ratios. For example, the $Al_2O_3$ may be contained at 1 mol % to 10 mol %, the $Na_2O$ may be contained at 10 mol % to 20 mol %, and the $SiO_2$ may be contained at 55 mol % to 70 mol %.

In an exemplary embodiment of the present invention, the $Al_2O_3$ and $Na_2O$ may be contained in the glass material at a certain ratio such that the impact resistance of the glass substrate GL is increased. For example, the ratio of $Al_2O_3/Na_2O$ may be equal to or smaller than 1. When the ratio of $Al_2O_3/Na_2O$ is greater than about 1, the impact resistance of the glass substrate GL may be weakened, and the glass substrate GL may be broken by a weak impact. In an exemplary embodiment of the present invention, the ratio of $Al_2O_3/Na_2O$ may be 0.5. In an exemplary embodiment of the present invention, the ratio of $Al_2O_3/Na_2O$ may be 0.2 to 0.5. In an exemplary embodiment of the present invention, the ratio of $Al_2O_3/Na_2O$ may be 0.3 to 0.4.

In an exemplary embodiment of the present invention, the material of the glass substrate GL is not limited to the above-described contents, and the glass substrate GL may have various other materials and various material ratios. The glass substrate GL may have a relatively lower elastic modulus than other glass substrates.

In an exemplary embodiment of the present invention, the glass substrate GL may have flexibility and can be curved, folded, or rolled. In an exemplary embodiment of the present invention, the glass substrate GL may be folded or rolled in the third direction D3. For example, a portion of the first surface S1 may be folded in a direction in which a first portion of the first surface S1 faces a second portion of the first surface S1, or may be rolled in a rolling mode such that a portion of the second surface S2 faces the first surface S. Hereinafter, for convenience of illustration, a case where the glass substrate GL may be curved, folded, or rolled will be described.

In an exemplary embodiment of the present invention, the glass substrate GL may have a thickness of about 100 μm or less. When the glass substrate GL has a thickness of over about 100 μm, a repulsive force of the glass substrate GL against deformation is increased. Therefore, the bending of the glass substrate GL may be difficult. In an exemplary embodiment of the present invention, the glass substrate GL may have a thickness of about 25 μm to about 100 μm. When the thickness of the glass substrate is less than about 25 μm, the rigidity of the glass substrate GL is low. Therefore, the glass substrate GL may be damaged in a process. However, the glass substrate GL may be fabricated to have a thickness of less than about 25 μm when it can meet a predetermined level of rigidity and processability. In an exemplary embodiment of the present invention, the glass substrate GL may have a thickness of about 50 μm to about 80 μm. In the specification, when it is stated that that the glass substrate GL is damaged, the significance of the statement is that the window substrate WD cannot be used for an intended purpose, for example, the glass substrate GL is broken, a flaw or crack is formed in the glass substrate GL, the flaw or crack has propagated throughout the glass substrate GL, or the glass substrate GL is ruptured.

The window substrate WD, including the glass substrate GL, can be curved or folded with a relatively small radius of curvature.

When the glass substrate GL has a small thickness, when an object having a narrow sectional area, such as a pen, collides with the top surface of the glass substrate, the glass substrate GL may be folded. In this case, a large stress may be applied to the surfaces of the folded glass substrate GL. Therefore, a bending breakage may occur, in which the glass substrate GL is damaged by the stress. To reduce the bending breakage, the resistance of the glass substrate GL to impact may be increased.

In an exemplary embodiment of the present invention, the glass substrate GL may be a glass chemically reinforced by an ion exchange process to increase the impact resistance thereof. In the specification, the term "ion exchange process" may mean that the glass exchanges a positive ion of the same atomic value with a positive ion located on or near the surface of the glass. For example, the ion exchange process may mean that a positive ion (e.g., a positive ion of an alkali metal such as $Na^+$ or $Li^+$) inside the glass is exchanged with another positive ion from the outside (e.g., from a salt bath solution). The ion exchange process may be used to provide a profile of compressive stress extending to a specific depth from a first surface (e.g., the first surface S1) and/or a second surface (e.g., the second surface S2) of the glass. When the compressive stress is provided to the glass substrate GL, a high strength may be provided in the bending of the glass substrate GL, as long as a flaw included in the glass substrate GL is located within a region where the compressive stress is 0 in a compressive stress graph.

Figure 2A:
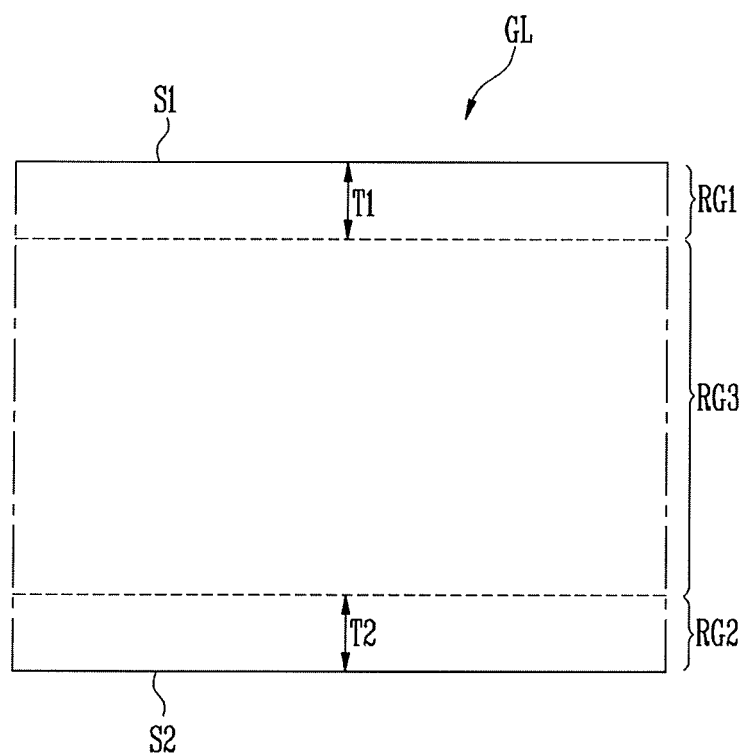
FIG. 2A is a sectional view illustrating a glass substrate according to an exemplary embodiment of the present invention.
Figure 2B:
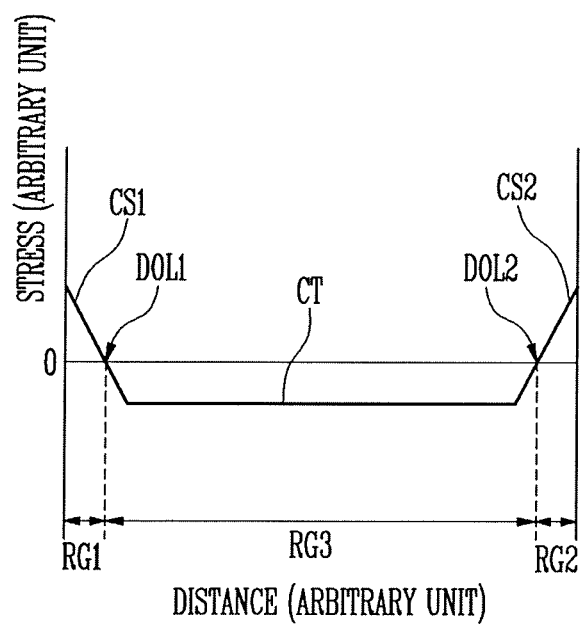
FIG. 2B is a graph of stress versus distance from a surface of the glass substrate of FIG. 2A, according to an exemplary embodiment of the present invention.

FIG. 2A is a sectional view illustrating a glass substrate according to an exemplary embodiment of the present invention. FIG. 2B is a graph of stress versus distance from a surface of the glass substrate GL of FIG. 2A, according to an exemplary embodiment of the present invention.

Referring to FIGS. 2A and 2B, the glass substrate GL includes a first region RG1 extending to a first depth DOL1 from the first surface S1, a second region RG2 extending to a second depth DOL2 from the second surface S2, and a third region RG3 located between the first region RG1 and the second region RG2.

In the first region RG1, the first depth DOL1 is a depth at which a positive ion inside the glass substrate GL is exchanged with a positive ion from the outside. Accordingly, the first region RG1 has a first thickness T1. A first compressive stress CS1 is applied to the first region RG1 by the ion exchange. The first compressive stress CS1 decreases from the first surface S to the first depth DOL1, according to a predetermined function (e.g., a function that describes a relationship between the stress and depth in the glass substrate GL), and becomes 0 at the first depth DOL1. The entire compressive stress stored in the first region RG1 may be represented by the area under a specific (e.g., predetermined) function in the depth direction of layers from the first surface S1.

The first region RG1 can offset a tensile stress generated in the glass substrate GL while the glass substrate GL is being folded, particularly, a tensile stress reaching a maximum value in the vicinity of the first surface S1.

In the second region RG2, the second depth DOL2 is a depth at which a positive ion inside the glass substrate GL is exchanged with a positive ion from the outside. Accordingly, the second region RG2 has a second thickness T2. A second compressive stress CS2 is applied to the second region RG2 by the ion exchange. The second compressive stress CS2 decreases from the second surface S2 to the second depth DOL2 according to a predetermined function. The second compressive stress CS2 becomes 0 at the second depth DOL2. The entire compressive stress stored in the second region RG2 may also be represented by the area under a specific function in the depth direction of layers from the second surface S2. The portions of the glass substrate GL on which the first compressive stress CS and the second compressive stress CS2 act upon are reinforced. The reinforced portions increase the glass substrate's GL resistance to external impact or other external forces.

The second region RG2 can offset a tensile stress generated in the glass substrate GL while the glass substrate GL is being folded, particularly, a tensile stress reaching a maximum value in the vicinity of the second surface S2.

The functions related to the above-described compressive stresses may be changed depending on the kind of the glass substrate GL, the kind of the ion that was exchanged, a condition in the ion exchange, etc., but the compressive stress may decrease in the direction from the first surface S1 to the third region RG3. In addition, the compressive stress may decrease in the direction from the second surface S2 to the third region RG3. In an embodiment of the present invention, the two functions have been shown in the form of straight lines for convenience of illustration. However, the increase or decrease of the functions is not limited thereto, and the function type to the first depth DOL1 to the second depth DOL2 may be variously changed. For example, the function value may be constant, may decrease and then increase, or may increase and then decrease.

In an exemplary embodiment of the present invention, the first depth DOL1 and/or the second depth DOL2 may be different depending on the thickness of the glass substrate GL. For example, the first depth DOL1 and/or the second depth DOL2 may be equal to or smaller than ⅓ or ¼ of the thickness of the glass substrate GL.

When the positive ion from the outside is a first ion and the positive ion inside the glass substrate GL is a second ion, the first ion may be $K^+$ and the second ion may be $Na^+$ or $Li^+$.

The first compressive stress CS1 and the second compressive stress CS2 are balanced by a central tension CT stored in the third region RG3. The central tension CT is a tensile stress.

In an exemplary embodiment of the present invention, the first depth DOL1 is substantially the same as the second depth DOL2. In addition, the first compressive stress CS1 at the first surface S1 of the glass substrate GL is substantially the same as the second compressive stress CS2 at the second surface S2 of the glass substrate GL. As a result, the compressive stresses at both the surfaces of the glass substrate GL may be symmetrical to each other.

When the glass substrate GL is folded or rolled, a compressive stress is applied to the first surface S1 or the second surface S2, which corresponds to an inner circumferential surface, and a tensile stress is applied to the second surface S2 or the first surface S1, which corresponds to an outer circumferential surface.

In an exemplary embodiment of the present invention, in the glass substrate GL, each of the first depth DOL1 and the second depth DOL2 may be about 1 µm to about 15 µm. In addition, in the glass substrate GL, each of the first compressive stress CS1 and the second compressive stress CS2, applied in chemical reinforcement, may be about 600 MPa to about 1200 MPa. When each of the first depth DOL1 and the second depth DOL2 is less than about 1 µm, and/or when each of the first compressive stress CS1 and the second compressive stress CS2 is out of the above-described range, it may be difficult to compensate for the tensile stress applied to the glass substrate GL, and damage caused by a flaw may occur.

When a flaw is formed at a certain position of the first surface S1 or the second surface S2, if the flaw exists within a region where the compressive stress is 0 in the compressive stress graph, the tensile strength may be compensated by the compressive strength. In this case, the glass substrate GL might not break, and damage caused by the flaw may be prevented.

In an exemplary embodiment of the present invention, the chemical reinforcement may be symmetrically performed on the two surfaces of the glass substrate. However, the present invention is not limited thereto, and the chemical reinforcement may be asymmetrically performed. For example, when the glass substrate GL is folded in a specific direction, e.g., when the glass substrate GL is folded such that both ends of the first surface S1 face each other, the compressive stress is applied to the first surface S1, and the tensile stress is applied to the second surface S2. In this case, when the kinds of stresses applied to the first and second surface S1 and S2 are different from each other, the chemical reinforcement for compensating for the stresses may also be asymmetrically performed.

Figure 3A:
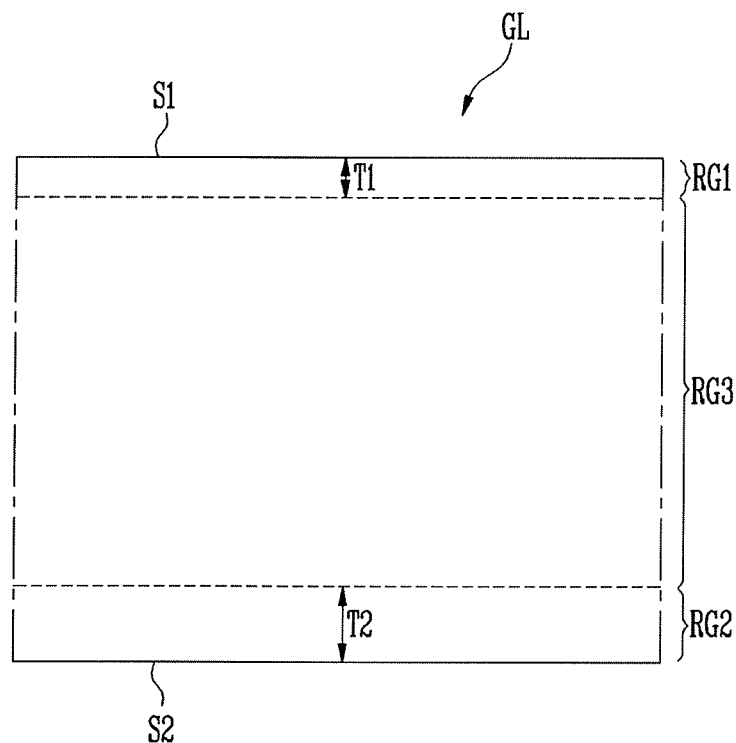
FIG. 3A is a sectional view illustrating a glass substrate according to an exemplary embodiment of the present invention.
Figure 3B:
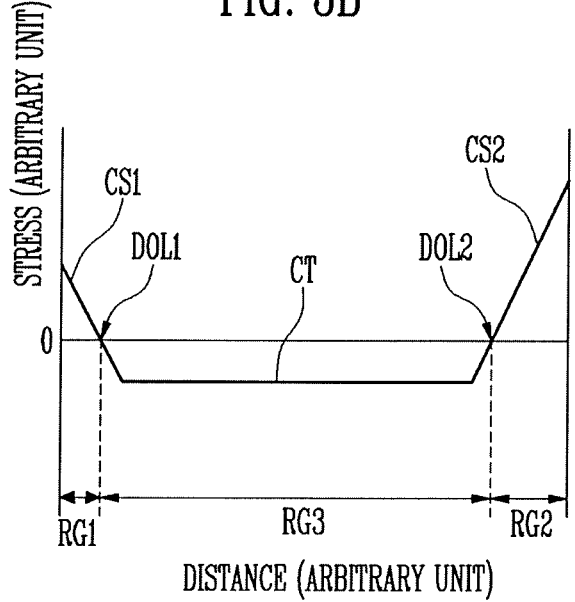
FIG. 3B is a graph of stress versus distance from a surface of the glass substrate of FIG. 3A, according to an exemplary embodiment of the present invention.

FIG. 3A is a sectional view illustrating a glass substrate GL according to an exemplary embodiment of the present invention. FIG. 3B is a graph of stress versus distance from a surface of the glass substrate GL of FIG. 3A, illustrating.

Referring to FIGS. 3A and 3B, in the glass substrate GL, a first region RG1 and a second region RG2 are asymmetrically provided. A first depth DOL1 of the first region RG1 is smaller than a second depth DOL2 of the second region RG2. For example, the first depth DOL1 of the glass substrate GL of FIGS. 3A and 3B is smaller than the first depth DOL1 of the glass substrate GL shown in FIGS. 2A and 2B. Accordingly, a first compressive stress CS1 of the glass substrate GL of FIGS. 3A and 3B is smaller than the first compressive stress CS1 of the glass substrate GL shown in FIGS. 2A and 2B. The second depth DOL2 of the glass substrate GL of FIGS. 3A and 3B is greater than the second depth DOL2 of the glass substrate GL shown in FIGS. 2A and 2B. Accordingly, a second compressive stress CS2 of the glass substrate GL of FIGS. 3A and 3B is greater than the second compressive stress CS2 of the glass substrate GL shown in FIGS. 2A and 2B.

Thus, when a flaw is formed at a certain position of the second surface S2 of the glass substrate GL, the flaw may be located in a region of the glass substrate GL where the compressive stress is 0. In this case, no damage may occur to the glass substrate GL. In other words, although a tensile stress may be applied to the glass substrate GL when flaw is formed in the second surface S2, corresponding to an outer circumferential surface of the glass substrate GL, the second compressive stress CS2 can compensate for the tensile stress. Accordingly, damage to the glass substrate GL may be prevented.

Several methods may be used to form a thin glass substrate GL on which a chemical reinforcement treatment is performed. For example, the glass substrate GL may be fabricated by a method including fusion, slot drawing, rolling, redrawing, and/or float processes.

As an example, a mother glass substrate, from which the glass substrate GL is formed, may be manufactured to have a thickness of about 100 man or less. Subsequently, the mother glass substrate may be processed to have a predetermined shape by cutting, beveling, baking, etc., and a chemical reinforcement treatment may then be performed on the mother glass substrate.

In addition, a mother glass substrate, having a predetermined thickness, may be manufactured. Subsequently, a slimming process of making the mother glass substrate to have a thickness of about 100 µm or less may be performed. Then, shape processing and chemical reinforcement treatment may be sequentially performed. In this case, the slimming process may be performed by a mechanical method and/or a chemical method.

For example, the glass substrate GL, according to an embodiment of the present invention, may be fabricated by preparing a mother glass substrate, immersing the mother glass substrate in an ion exchange salt, and then heating the mother glass substrate. Hereinafter, an ion which is included in the ion exchange salt, and is to be substituted for an ion included in the glass mother substrate, is referred to as a first ion, and an ion included in the mother glass substrate is referred to as a second ion.

A mother glass substrate to be chemically reinforced through ion exchange may be manufactured.

Then, the mother glass substrate is immersed in an ion exchange salt bath. The ion exchange salt bath includes a first ion to be exchanged with a second ion in the mother glass substrate. Through the immersion, the first ion is provided on the first and second surfaces of the mother glass substrate. In an exemplary embodiment of the present invention, the first ion may be $K^+$ and the second ion may be $Na^+$ or $Li^+$. The first and second ions may be provided in forms of $KNO^3$ and $NaNO^3$, respectively.

Then, the immersed mother glass substrate is heated to a first temperature for a predetermined time. Through the heating, the first ion provided to the first and second surfaces is diffused into the mother glass substrate through the first and second surfaces and then exchanged with the second ion in the mother glass substrate. Accordingly, an ion-exchanged glass substrate GL is fabricated. In the ion-exchange process, the second ions originally existing in the mother glass substrate remain in the third region RG3 of the ion-exchanged glass substrate GL, and the second ion existing in each of first and second regions of the ion-exchanged glass substrate GL is exchanged with the first ion.

The first temperature and the heating time for maintaining the first temperature may be differently set depending on the degree of exchange of the ions. In an exemplary embodiment of the present invention, the first temperature may be about 370° C. to about 410° C., and the heating time may be about one hour to about six hours.

The mother glass substrate may be slimmed at any of the first and second surfaces S1 and S2. The mother glass substrate may be slimmed using an etchant. However, the present invention is not limited thereto, and any method may be used as long as it can reduce the thickness of the mother glass substrate. For example, a sponge containing the etchant may be contacted with a surface of the mother glass substrate, or the etchant may be repeatedly sprayed onto a certain region of the mother glass substrate using a spray tool. In addition, when the mother glass substrate is immersed in an etchant, a portion of the mother glass substrate, which is immersed in the etchant, may be controlled such that a partial region of the mother glass substrate is repeatedly immersed in the etchant.

In an exemplary embodiment of the present invention, the step of slimming the mother glass substrate is performed after the ion exchange, but the present invention is not limited thereto. For example, the step of slimming the mother glass substrate may be performed before the mother glass substrate is immersed in the ion exchange salt bath.

In an exemplary embodiment of the present invention, an additional process may be performed on the glass substrate GL. In addition, the glass substrate GL may be cleaned at least once.

As described above, since the mother glass substrate is immersed in the ion exchange salt bath, the first surface S1 and the second surface S2 of the mother glass substrate come in contact with the ion exchange salt bath, and ions are exchanged in the glass substrate GL. In an embodiment of the present invention, the glass substrate GL, fabricated through the above-described processes, has predetermined depths of the first and second regions RG1 and RG2, and predetermined stresses in the first and second regions RG1 and RG2.

As described above, in the glass substrate GL, according to an embodiment of the present invention, the damage to the glass substrate GL may be reduced even though a flaw may be formed in a surface to which the tensile stress is applied when the glass substrate GL is folded or rolled. When the glass substrate GL is an ultra-thin substrate, e.g., when the glass substrate GL has a thickness of less than about 100 μm, the probability of formation or growth of a flaw resulting from the tensile stress, which occurs when the glass substrate GL is folded or rolled, may be reduced. Accordingly, the probability that the glass substrate GL will be damaged is reduced.

In an exemplary embodiment of the present invention, since the window substrate WD includes a chemically reinforced glass substrate GL, the bending rigidity of the glass substrate GL may be lowered, and the window substrate WD may be easily curved or folded. However, the glass substrate GL may be broken, cracked or shattered from an impact to the window substrate WD. Therefore, the durability of the glass substrate GL against breakage, cracking or shattering may need to be increased.

A coating layer CTL may be disposed on the glass substrate GL. The coating layer CTL may increase the impact resistance of the window substrate WD and prevent the glass substrate GL from being cracked or shattered.

The coating layer CTL may be disposed on the first surface S1 or the second surface S2 of the glass substrate GL.

In an exemplary embodiment of the present invention, the coating layer CTL may be disposed on the surface of the glass substrate GL which is adjacent to a display panel. In other words, the coating layer CTL may be disposed between the glass substrate GL and the display panel.

The coating layer CTL may be disposed on the glass substrate GL. The coating layer CTL may increase the impact resistance of the window substrate WD and reduce the probability of the glass substrate GL being shattered from the impact. When an impact is applied to a portion of the glass substrate GL, the coating layer CTL offsets a tensile stress generated in the glass substrate GL due to impact. Accordingly, the probability of breakage or cracking of the glass substrate GL due to the impact may be reduced. In addition, the coating layer CTL absorbs impact energy generated when the glass substrate GL is broken to prevent minute fragments of glass from being scattered. The coating layer CTL may include an elastic material to absorb the impact energy, and may include a flexible material that may be curved or folded. In addition, since the coating layer CTL may directly contact the glass substrate GL, the coating layer CTL may be adhered to the glass substrate GL.

In an exemplary embodiment of the present invention, the coating layer CTL may include urethane resin, epoxy resin, polyester resin, polyether resin, acrylate resin, acrylonitrile-butadiene-styrene (ABS) resin, and/or rubber. For example, the coating layer CTL may include polyurethane (PU), or may include a material obtained by adding rubber to the PU or adding an acrylic monomer to the PU.

In an exemplary embodiment of the present invention, the coating layer CTL may have a Young's modulus of about 2 GPa to about 4 GPa. The Young's modulus may be adjusted as the above-described materials of the coating layer CTL are used in different combinations.

In an exemplary embodiment of the present invention, the coating layer CTL may be directly coupled to the glass substrate GL. The coating layer CTL may be formed on the glass substrate through coating. For example, the coating layer CTL may be formed on the glass substrate GL through slip coating, bar coating, spin coating, or the like. In an exemplary embodiment of the present invention, the coating layer CTL may be formed on the entire surface of the glass substrate GL.

The coating layer CTL may have a thickness of exceeding 0 μm and equal to or smaller than about 50 μm. In an exemplary embodiment of the present invention, the coating layer CTL may have a thickness of about 1 μm to about 30 μm. In an exemplary embodiment of the present invention, the coating layer CTL may have a thickness of about 3 μm to about 12 μm. In an exemplary embodiment of the present invention, the coating layer CTL may have a thickness of about 3 μm to about 10 μm. When the coating layer CTL is not provided, the impact energy that causes the glass substrate GL to shatter into minute glass fragments may not be absorbed. When the coating layer CTL is provided and has a thickness greater than about 50 μm, the bending rigidity of the coating layer CTL may be increased. In addition, when the coating layer CTL has a thickness greater than about 50 μm, the degree of deformation of the glass substrate GL due to impact is increased, and therefore, the tensile stress generated in the glass substrate GL may be increased.

The coating layer CTL may have a smaller elastic modulus than the glass substrate GL. As described above, the coating layer CTL may include an elastic material to absorb the impact energy generated when the glass substrate GL is impacted. In addition, as shown in the following Expression 1, the bending rigidity of the coating layer CTL is in proportion to the elastic modulus of the coating layer CTL, and hence the coating layer CTL has a smaller elastic modulus than the glass substrate. Thus, the coating layer CTL might not affect the flexibility of the window substrate WD.

In an exemplary embodiment of the present invention, the elastic modulus of the coating layer CTL may be equal to or smaller than about 10 GPa. In an exemplary embodiment of the present invention, the elastic modulus of the coating layer CTL may be about 1 GPa to about 5 GPa. In an exemplary embodiment of the present invention, the elastic modulus of the coating layer CTL may be about 2 GPa to about 4 GPa. For example, the glass substrate GL, directly coupled to the coating layer CTL, may have an elastic modulus of about 70 GPa or so. When the coating layer CTL has an elastic modulus smaller than about 1 GPa, the degree of deformation of the glass substrate GL due to impact is increased, and therefore, the tensile stress generated in the glass substrate GL may be increased. In addition, when the coating layer CTL has an elastic modulus greater than about 5 GPa, the impact energy which may cause the glass substrate GL to shatter into minute glass fragments may not be absorbed.

In an exemplary embodiment of the present invention, the light transmittance of the coating layer CTL may be equal to or greater than about 90%. Light emitted from pixels of the display panel can be viewed by a user through the window substrate WD. The light emitted from the pixels can pass through the coating layer CTL, which may cover the entire surface of the glass substrate GL. Since the coating layer CTL has a good light transmittance, the luminance of light emitted from the display panel may not be lowered.

In an exemplary embodiment of the present invention, since the coating layer CTL is disposed to the glass substrate GL, the difference in repulsive force (e.g., the repulsive force against deformation) between the glass substrate GL alone and the glass substrate GL having the coating layer CTL may be within 50% of the repulsive force of the glass substrate GL. In other words, when the glass substrate has the repulsive force of 1 unit of force, the glass substrate and the coating layer may have the repulsive force greater than 1 unit of force and smaller than or equal to 1.5 units of force. In an exemplary embodiment of the present invention, the difference in repulsive force may be within 10% of the repulsive force of the glass substrate GL, or when the glass substrate has the repulsive force of 1 unit of force, the glass substrate and the coating layer may have the repulsive force greater than 1 unit of force and smaller than or equal to 1.1 units of force.

For example, in a glass substrate (e.g., Gorilla3 Glass) having a size of 169.4 mm×101.2 mm and a thickness of 70 μm, the Young's modulus of the glass substrate is 69.3 GPa. When the radius of curvature of the glass substrate is 5 mm, a distance D may be considered as 10 mm. In this example, the repulsive force of the glass substrate is about 7.6 N. When the coating layer CTL is formed on the glass substrate GL, the material or thickness of the coating layer CTL may be selected such that the difference in repulsive force is equal to or smaller than about 3.8 N. For example, the repulsive force of the coating layer CTL and the glass substrate is equal to 7.6N+3.8 N (or less than 7.6N+3.8N).

As described above, the coating layer CTL prevents breakage of the glass substrate GL when impact is applied to the window substrate WD. Accordingly, the impact resistance of the window substrate WD may be increased.

The window substrate WD may have an impact resistance of at least about 4 cm, based on when a specific pen (e.g., a Fine BIC pen produced by Societe BIC) having a weight of about 5.8 g, which is covered with a lid, freely drops from a given height on the surface of the window substrate WD. In this case, the window substrate WD may be horizontal and the pen is dropped on the window substrate WD vertically, by gravity. In other words, when the pen drops on the window substrate WD from a height of about 4 cm or less, the window substrate WD may not break. An impact resistance test using a specific pen will be described below.

In an exemplary embodiment of the present invention, the window substrate WD, having the above-described structure, may have a folding reliability of about 200,000 times. The folding reliability means that the window substrate WD is not damaged even when it is folded a plurality of times. A folding reliability may be performed in a plurality of cycles, using a Clamshell folding reliability test.

A cycle of the Clamshell folding reliability test may include bringing both end portions of the window substrate WD to face each other and then stretching the window substrate WD in a flat state. The cycle may be repeated a plurality of times. In an exemplary embodiment of the present invention, when the window substrate WD is applied to another device, e.g., a display device, the window substrate WD may be folded plural times. Therefore, the folding reliability test is performed as a test for ensuring reliability when the window substrate WD is folded plural times. In the folding reliability test, the window substrate WD is placed on a test plate. The test plate includes a stationary plate and a rotatable plate which may be rotated between the stationary plate and a single- or multi-shaft folding gear. In the folding reliability test, the glass substrate GL is maintained flat for a predetermined time (e.g., about one second) by disposing the window substrate WD on the stationary plate and the rotatable plate, which are placed on the same plane, and the rotatable plate is moved to be parallel to the stationary plate in a state in which the rotatable plate is spaced apart from the stationary plate. Accordingly, the window substrate WD is in a state in which it is folded between the two plates while having a predetermined curvature. In this state, the glass substrate GL is again maintained for the predetermined time (e.g., about one second). Next, as the rotatable plate is returned to the initial state, the glass substrate GL remains flat in the initial state by disposing the window substrate WD on the stationary plate and the rotatable plate, which are placed on the same plane, so that one cycle is completed. Conditions in the folding reliability test may be changed. When the rotatable plate is parallel to the stationary plate in the state in which the rotatable plate is spaced apart from the stationary plate, the distance between the rotatable plate and the stationary plate is D, and D/2 substantially corresponds to the radius of curvature. The distance D may be controlled to be about 1 mm to about 10 mm, using the folding gear.

For example, the conditions in the folding reliability test may be changed depending on a thickness of the window substrate WD, a target radius of curvature, and a compressive stress after chemical reinforcement. In addition, the folding reliability test may be performed in a first direction.

However, the folding reliability test may also be performed in a first direction and in a second direction opposite to the first direction.

In an exemplary embodiment of the present invention, the window substrate WD may not be damaged when it is folded 50,000 times at a temperature of 85 t and a humidity of 85%. In addition, the window substrate WD may not be damaged when it is folded 50,000 times at a temperature of 60° C. and a humidity of 93%.

In an exemplary embodiment of the present invention, the window substrate WD may have a transmittance of 90% or more. As the material and thickness of the glass substrate GL and/or the coating layer CTL is controlled, the transmittance may be adjusted. In an exemplary embodiment of the present invention, when the window substrate WD is applied to a display device, the window substrate WD has a large transmittance such that the transmittance of an image from the display device is maximized.

In an exemplary embodiment of the present invention, the yellow index variation $\Delta Y1$ of the window substrate WD may be equal to or smaller than 1.0 even when the window substrate WD is exposed to ultraviolet B (UVB) light having a wavelength of 280 nm to 360 nm for 72 hours. When the window substrate WD is applied to another device such as a display device, the window substrate WD may be exposed to direct light including UV light. However, a color variation does not occur in the window substrate WD under such a condition. In an exemplary embodiment of the present invention, a color variation does not occur in the window substrate WD when exposed to direct light including UV light.

In an exemplary embodiment of the present invention, the haze value of the window substrate WD may be equal to or smaller than 1.0%.

In an exemplary embodiment of the present invention, the window substrate WD may have abrasion resistance ability. An abrasion resistance ability evaluation is performed in a manner that allows a steel wool #0000 having a diameter of 20 mm, which is commercially available from Liberon, to make a round trip 45 times per minute in a state in which the steel wool #0000 contacts a top surface of the glass substrate GL. The grain direction of the steel wool is the same as the direction of reciprocal movement. The abrasion resistance evaluation is performed by considering that, when the window substrate WD is applied to a device such as a display device, a flaw such as a scratch may be caused by a user. In the window substrate WD, according to an exemplary embodiment of the present invention, no scratch occurred during ten cycles.

In an exemplary embodiment of the present invention, the window substrate WD may have a folding reliability of 200,000 times. The folding reliability means that the window substrate WD is not damaged even when it is folded plural times. The folding reliability test may include performing the folding test in a plurality of cycles.

In an exemplary embodiment of the present invention, the glass substrate GL may have a radius of curvature of about 1 mm to about 10 mm or about 1 mm to about 5 mm. In this case, the glass substrate GL is not damaged.

According to an exemplary embodiment of the present invention, in order for the window substrate WD to be easily curved or folded, layers included in the window substrate WD are to have a relatively small bending stiffness. The bending stiffness of a single layer may be represented by the following Expression 1.

$$BS \propto E \times TH^3. \quad \text{Expression 1:}$$

In Expression 1, BS denotes the bending stiffness of the single layer, E denotes an elastic modulus of the single layer, and TH denotes a thickness of the single layer.

The bending stiffness of the glass substrate GL is in proportion to the cube of the thickness of the glass substrate GL. Accordingly, the thickness of the glass substrate GL is to be small such that the glass substrate GL may have a small bending stiffness.

In an exemplary embodiment of the present invention, the window substrate WD may have a repulsive force of about 10 N or less in deformation thereof. When the window substrate WD is applied to a display device, etc., the window substrate WD may be folded plural times, and the repulsive force when a user folds the window substrate WD may be strong enough to allow the user to not feel discomfort.

The repulsive force in deformation of the glass substrate GL may be defined by the following Expression 2.

$$F = \frac{wt}{6\left(\frac{E}{1-v^2}\right)}\left(1.19814 \frac{E}{1-v^2} \frac{t}{D-t}\right)^2. \quad \text{Expression 2}$$

In Expression 2, E denotes a Young's modulus, w denotes a width of the glass substrate GL, t denotes a glass thickness of the glass substrate GL, u denotes a Poission ratio, and D is a distance between both end portions of the glass substrate GL, which face each other in folding. The folding is performed by folding the glass substrate GL such that both the end portions of the glass substrate GL, having the width w, face each other. D may substantially correspond to two times of the radius of curvature of the glass substrate GL. Therefore, the glass substrate GL may be set to have a radius of curvature of about 1 mm to about 10 mm or about 1 mm to about 5 mm, and the D may correspond to the radius of curvature.

According to Expression 2, the repulsive force when the thickness of the glass substrate GL is about 100 μm and D is 10 mm in a state in which other conditions are the same corresponds to about three times of the repulsive force when the thickness of the glass substrate GL is about 70 μm.

The repulsive force is in proportion to the square of a stress applied in the folding of the window substrate WD, and the stress applied in the folding may be obtained from the following Expression 3.

$$\sigma = 1.19814 \times \frac{E}{1-v^2} \times \frac{t}{D-t}. \quad \text{Expression 3}$$

In Expression 3, E denotes Young's modulus, t denotes a glass thickness, u denotes a Poission rate, w denotes a width of the glass substrate GL, and D is a distance between both end portions of the glass substrate GL, which face each other in folding. The folding process includes folding the glass substrate GL such that both the end portions of the glass substrate GL, having the width w, face each other. D may substantially correspond to two times the radius of curvature of the glass substrate GL.

The window substrate WD, according to an exemplary embodiment of the present invention, may have a high breaking strength, e.g., a breaking strength of a minimum of 700 MPa (B10). The breaking strength may correspond to a strength to a degree where the window substrate WD is not broken even when a flaw having a size of about 3 μm exists in the glass substrate GL. B10 means a value representing the lower 10% in a Weibull distribution when the strength of a material is tested. In an exemplary embodiment of the present invention, when the glass substrate GL having a thickness of 70 μm, in which each of the first and second depths DOL1 and DOL2 is 13 μm, and the compressive stress is 750 MPa, is folded with a radius of curvature of 5 mm, the minimum strength corresponds to about 700 MPa.

The window substrate WD having the above-described structure, according to an exemplary embodiment of the present invention, has a high impact resistance.

Figure 4:
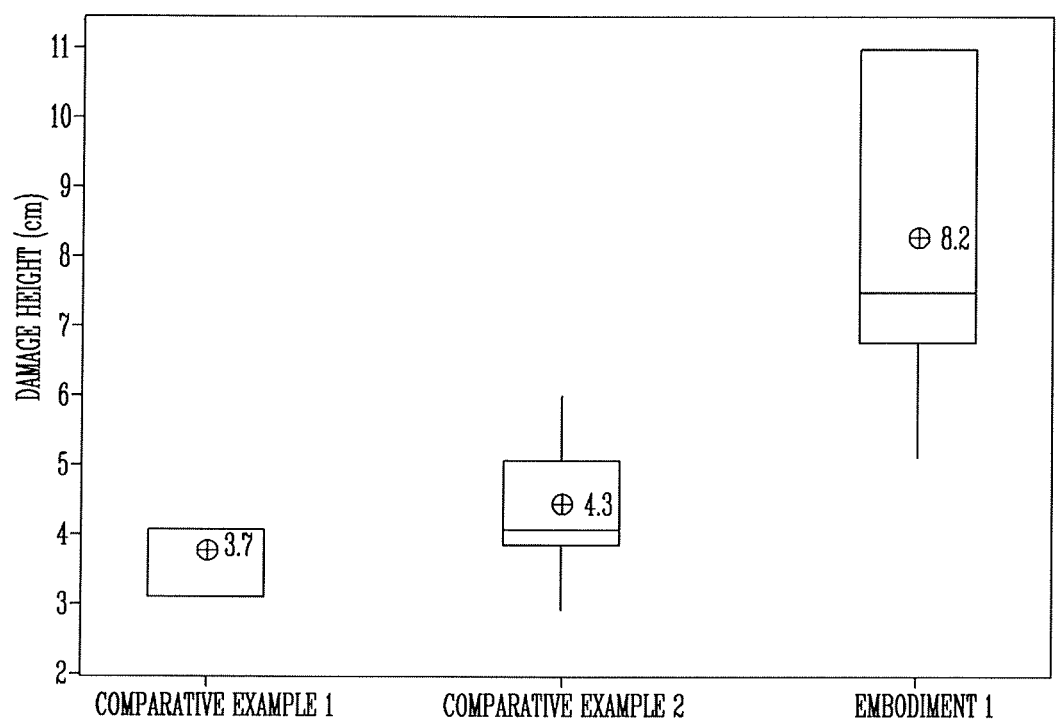
FIG. 4 is a graph illustrating the impact resistance of a glass substrate according to related art and a glass substrate according to an exemplary embodiment of the present invention.

FIG. 4 is a graph illustrating the impact resistance of a glass substrate according to related art and a glass substrate according to an exemplary embodiment of the present invention.

Comparative Examples 1 and 2 represent impact resistance of a glass substrate according to related art, and Embodiment 1 represents an impact resistance of the glass substrate GL according to an exemplary embodiment of the present invention. In FIG. 4, each glass substrate was adhered on a base film using an adhesive, and all conditions except the type of glass substrate were identically maintained.

A polyethylene terephthalate film having a thickness of 50 μm may be used as the base film.

The adhesive is used to attach the glass substrate to the base film. The adhesive is located under the glass substrate to attach the base film and the glass substrate together to form a single body and simultaneously distribute stress generated in the base film and the glass substrate at a room temperature. To prevent separation between the glass substrate and the base film, the adhesive requires a predetermined adhesion magnitude, a predetermined elastic modulus, and a predetermined creep under the condition of a room temperature of 25° C. and a humidity of 50%. Hence, the magnitude of the adhesion of the adhesive may be a minimum of 500 gf/in, the storage modulus of the adhesive may be a maximum of 100 MPa, and the creep of the adhesive may be 50% to 800%.

In addition, the glass substrate, in which the mole ratio of $Al_2O_3/Na_2O$ is 1.54, was used in Comparative Example 1, the glass substrate, in which the mole ratio of $Al_2O_3/Na_2O$ is 1.33, was used in Comparative Example 2, and a glass substrate GL, in which the mole ratio of $Al_2O_3/Na_2O$ is 0.33 was used in Embodiment 1. An impact resistance was evaluated by measuring a height at which damage occurred by allowing a specific pen (e.g., the Fine BIC pen produced by Societe BIC), having a weight of about 5.8 g, which is covered with a lid, to freely drop on the glass substrate/glass substrate GL, in a state in which the specific pen is perpendicular to the surface of a substrate.

Referring to FIG. 4, damage of the substrate occurred at a height of 4.5 cm or less in both of Comparative Example 1 and Comparative Example 2. However, damage of glass of the substrate occurred at a height of 8.2 cm in Embodiment 1. Accordingly, it can be seen that when the mole ratio of $Al_2O_3/Na_2O$ is maintained to 1 or less, the impact resistance of the glass substrate GL is increased.

Figure 5:
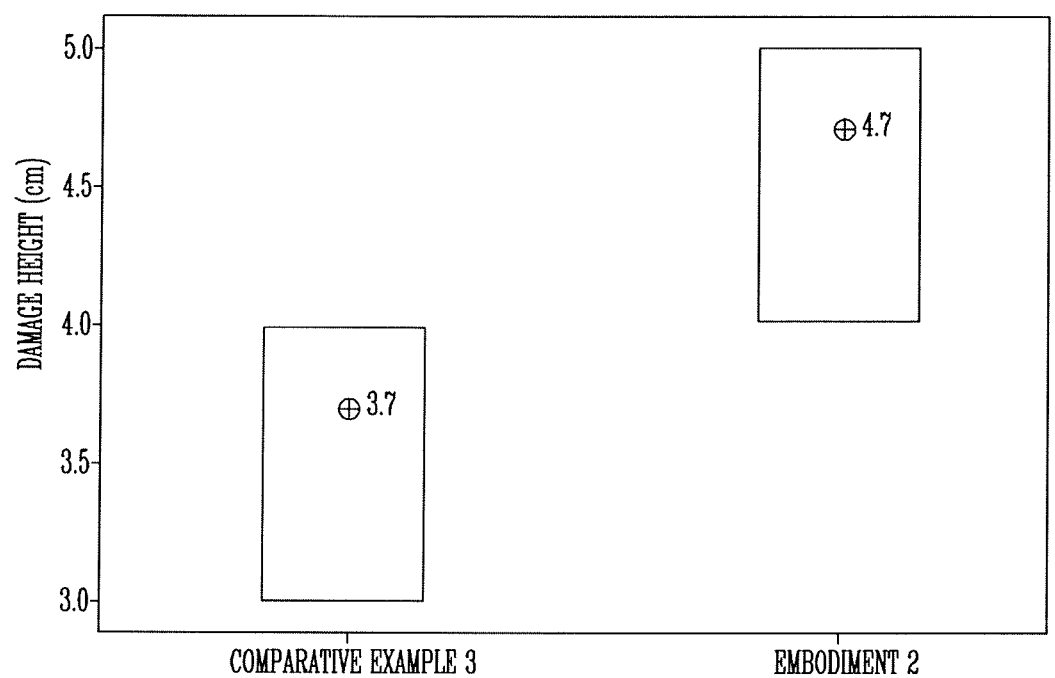
FIG. 5 is a graph illustrating impact resistance of a glass substrate according to a related art and a glass substrate according to an exemplary embodiment of the present invention.

In a window substrate WD, according to an exemplary embodiment of the present invention, the coating layer CTL may be applied to the glass substrate GL. Accordingly, the impact resistance of the windows substrate WD may be increased. FIG. 5 is a graph illustrating impact resistance of a glass substrate according to a related art and a glass substrate according to an exemplary embodiment of the present invention.

Comparative Example 3 shows an impact resistance of the window substrate according to the related art, and Embodiment 2 shows an impact resistance of the window substrate according to an exemplary embodiment of the present invention. In FIG. 5, each window substrate was adhered on a base film using an adhesive, and all conditions except the type of window substrate were identically maintained.

A polyethylene terephthalate film having a thickness of 50 μm may be used as the base film.

The adhesive is used to attach the window substrate to the base film. The adhesive is located under the window substrate to attach the base film and the window substrate as a single body and simultaneously distribute stress generated in the base film and the window substrate at a room temperature. To prevent separation between the window substrate and the base film, the adhesive requires a predetermined adhesion magnitude, a predetermined elastic modulus, and a predetermined creep under the condition of a room temperature of 25° C. and a humidity of 50%. Hence, the adhesion of the adhesive may be a minimum of 500 gf/in, the storage modulus of the adhesive may be a maximum of 100 MPa, and the creep of the adhesive may be 50% to 800%.

In FIG. 5, the impact resistance of the window substrate, according to the related art, was measured in a state in which a coating layer is not applied to a glass substrate, and the impact resistance of the window substrate, according to an exemplary embodiment of the present invention, was measured in a state in which a coating layer CTL is applied to a glass substrate. All conditions except the coating layer CTL were identically maintained. The impact resistance was evaluated by measuring a height at which damage occurred by allowing a specific pen (Fine BIC pen produced by Societe BIC) having a weight of about 5.8 g, which is covered with a lid, to freely drop, in a state in which the specific pen is perpendicular to the surface of the window substrate.

Referring to FIG. 5, in Comparative Example 3, in which a coating layer is not applied to the glass substrate, damage to the glass substrate occurred at a height of 3.7 cm. In Embodiment 2, in which the coating layer CTL is applied to the glass substrate, damage of the glass substrate occurred at a height of 4.7 cm. Accordingly, the coating layer CTL may increase the impact resistance of a glass substrate.

Figure 6:
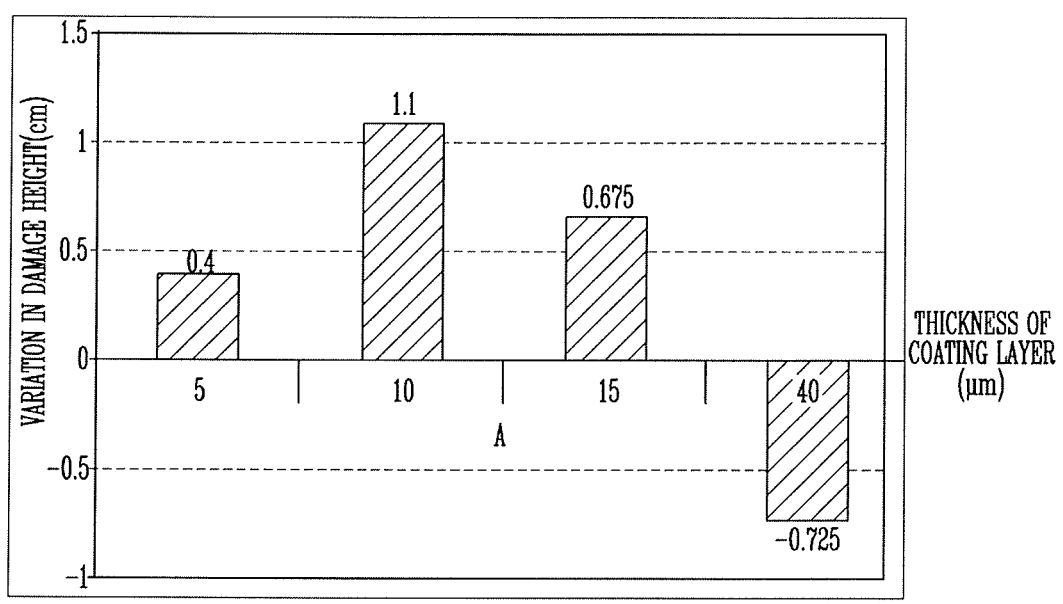
FIG. 6 is a graph illustrating a variation in damage height versus the thickness of a coating layer, according to one or more exemplary embodiments of the present invention.

The coating layer CTL may be applied in various thicknesses to the glass substrate. FIG. 6 is a graph illustrating a variation in damage height versus the thickness of a coating layer, according to one or more exemplary embodiments of the present invention. A variation in impact resistance corresponds to a difference in damage height of the BIC pen between the glass substrate to which the coating layer is not applied and the glass substrate to which the coating layer is applied.

Referring to FIG. 6, when thicknesses of the coating layer CTL are 5 μm, 10 μm, and 15 μm, respectively, the impact resistance was increased. When a thickness of the coating layer was 40 μm, the impact resistance was slightly decreased, but it was considered that the decreased impact resistance was at a permissible level.

In addition, the window substrate WD is not limited to the above-described form. Further, various functional layers may be added to the window substrate, and the window substrate may be modified in various other forms. In the evaluation of the impact resistance of the window substrate shown in FIG. 5, it was determined that the non-damage height of the specific pen was about 4 cm or more. However, the window substrate shown in FIG. 5 corresponds to a case where only the window substrate, having no separate buffer member, is evaluated. When the window substrate is applied to an actual display device, the window substrate may be combined with a separate buffer member, etc. In addition, as shown in FIG. 6, the impact resistance may be changed depending on the thickness of the coating layer in the window substrate. Therefore, the evaluation of the impact resistance of the window substrate WD may be changed depending on the thickness of the coating layer or whether a separate buffer member is provided. In addition, the non-damage height of a specific pen in the window substrate according to the embodiment of the present invention may be equal to or greater than about 4 cm.

FIGS. 7A to 7F are sectional views illustrating window substrates according to exemplary embodiments of the present invention.

Figure 7A:
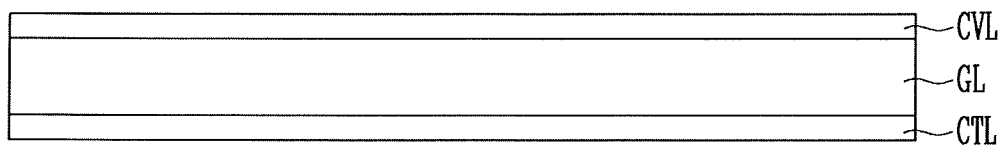
FIGS. 7A to 7F are sectional views illustrating window substrates according to exemplary embodiments of the present invention.

Referring to FIG. 7A, a window substrate WD, according to an exemplary embodiment of the present invention, may include various functional layers. The window substrate WD may further include a cover layer CVL disposed at a front side thereof as well as a coating layer CTL provided at a rear side thereof.

In an exemplary embodiment of the present invention, the cover layer CVL may be an anti-reflection layer for minimizing reflection at a top surface of a glass substrate GL. The cover layer CVL may be an anti-stain layer for preventing a stain such as a user's handprint (e.g., a fingerprint), but the present invention is not limited thereto. In addition, although the cover layer CVL is illustrated as a single layer in FIG. 7A, the present invention is not limited thereto, and a plurality of layers having various functions may be provided.

Figure 7B:
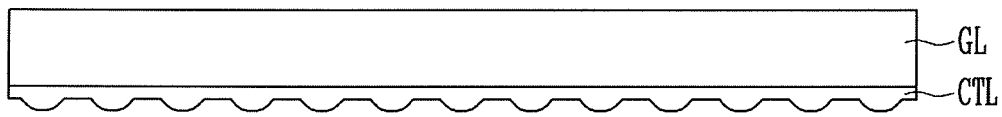

Referring to FIG. 7B, a window substrate WD, according to an exemplary embodiment of the present invention, may be provided in various forms. As shown in this figure, a coating layer CTL on a rear surface of a glass substrate GL may have a plurality of protrusions. The protrusions may be integrally formed with the coating layer CTL, and the section of the protrusion in one direction may have various shapes such as a semicircular shape, an elliptical shape, a triangular shape, a rectangular shape, a trapezoidal shape, and the like.

Figure 7C:
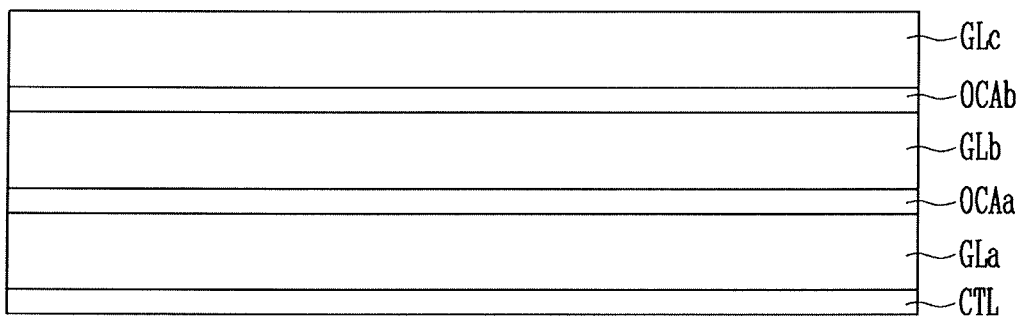

Referring to FIG. 7C, a window substrate WD, according to an exemplary embodiment of the present invention, may include a plurality of glass substrates GL and a coating layer CTL provided at a side of the glass substrates GL. In FIG. 7C, it has been illustrated that three glass substrates, e.g., first to third glass substrates GLa, GLb, and GLc are sequentially stacked. However, the number of glass substrates GL is not limited thereto, and two or four or more glass substrates may be provided.

An adhesive may be provided between adjacent glass substrates GL.

For example, a first adhesive OCAa may be provided between the first glass substrate GLa and the second glass substrate GLb, and a second adhesive OCAb may be provided between the second glass substrate GLb and the third glass substrate GLc. The adhesive may be an optically transparent adhesive.

Figure 7D:
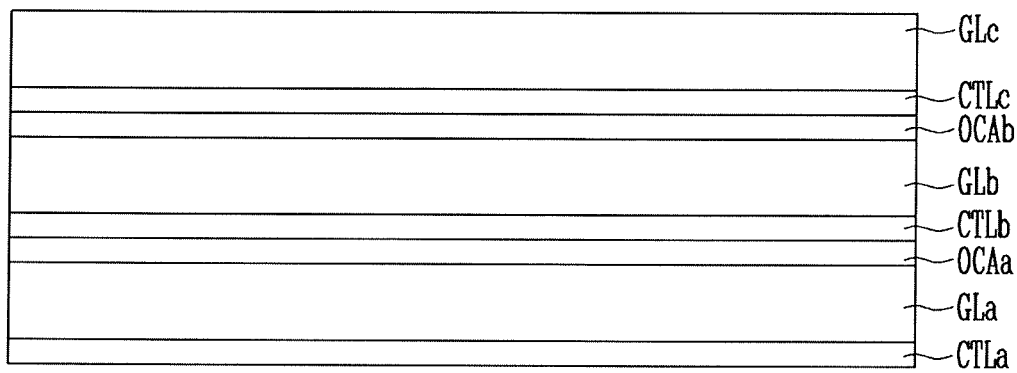

Referring to FIG. 7D, a window substrate WD, according to an exemplary embodiment of the present invention, may include a plurality of glass substrates GL and a coating layer CTL provided on a surface of each of the glass substrates GL. In FIG. 7D, it has been illustrated that coating layers CTL, e.g., first to third coating layers CTLa, CTLb, and CTLc are sequentially stacked on three glass substrates, e.g., first to third glass substrates GLa, GLb, and GLc, respectively. However, the number of glass substrates and the number of coating layers is not limited thereto. For example, a coating layer CTL may be provided on some glass substrates GL, but not on all the glass substrates GL, which are stacked on one another.

An adhesive may be provided between a glass substrate GL and a coating layer CTL, which are adjacent to each other. For example, a first adhesive OCAa may be provided between the first glass substrate GLa and the second coating layer CTLb, and a second adhesive OCAb may be provided between the second glass substrate GLb and the third coating layer CTLc. The adhesive may be an optically transparent adhesive.

Figure 7E:
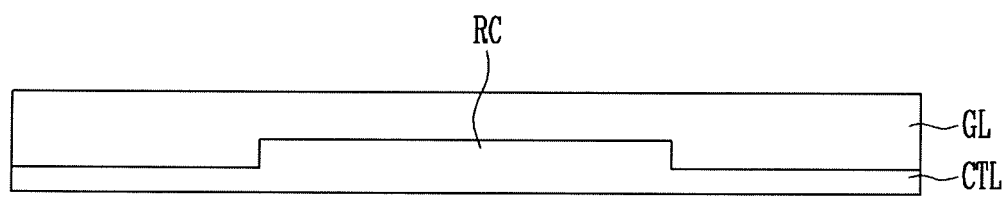
Figure 7F:
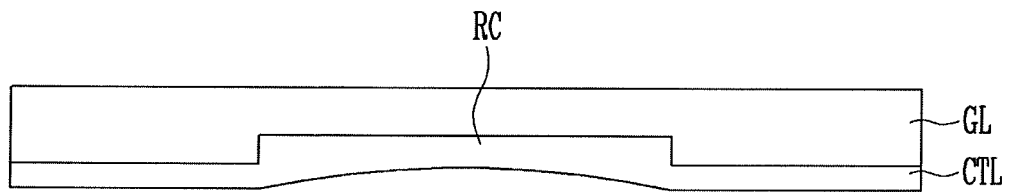

Referring to FIGS. 7E and 7F, in each of window substrates WD, according to exemplary embodiments of the present invention, a surface of a glass substrate GL may have various shapes, e.g., a protrusion and a recess. The glass substrate GL may have a recess that is concave in the direction from a rear surface of the glass substrate GL toward the inside of the glass substrate GL. Referring to FIG. 7E, a front surface of the coating layer CTL may fill in the recess RC and simultaneously cover a rear surface of the glass substrate GL. Therefore, the rear surface of the coating layer CTL may be flat. Referring to FIG. 7F, a front surface of the coating layer CTL may cover a rear surface of the glass substrate GL while partially filling in the recess RC. Therefore, the rear surface of the coating layer CTL may have a recess at the recess of the glass substrate GL. Accordingly, the rear surface of the coating layer CTL might not be flat. The thickness of the glass substrate GL may be decreased in a specific region of the glass substrate GL. Accordingly, the folding of the window substrate WD may be facilitated.

In FIGS. 7E and 7F, a case where the section of the recess RC has a linear shape has been illustrated, but the present invention is not limited thereto. The shape of the recess is not limited to that shown in FIGS. 7E and 7F as long as the recess RC has a shape that may reduce a compressive stress of the glass substrate GL.

In addition, when viewed on a plane, the recess RC may be formed to have various sizes at various positions. For example, by considering a direction in which the glass substrate GL is to be folded or rolled, the recess RC may be provided in a region corresponding to the direction of folding or rolling of the glass substrate GL. For example, when the glass substrate GL is folded or rolled such that a first surface of the glass substrate GL becomes an inner circumferential surface, the recess RC may be provided on the first surface. Alternatively, the recess RC may be formed on a major part (e.g., almost the entire surface) of the glass substrate GL.

When the recess RC is provided in the entire region or a partial region on the glass substrate GL, the thickness of the glass substrate GL is decreased in the region in which the recess RC is provided. Accordingly, the tensile stress generated in the glass substrate GL is decreased. As a result, the glass substrate GL is easily folded or rolled. When the glass substrate GL is bent such that compression is applied to the first surface S1 and tension is applied to the second surface S2, damage to the second surface S2 may be prevented or reduced.

The window substrates WD, having the recess RC, can be applied to various devices. For example, the window substrates WD, having the recess(es) RC, can be applied as window substrates for protecting display panels of display devices.

Figure 8:
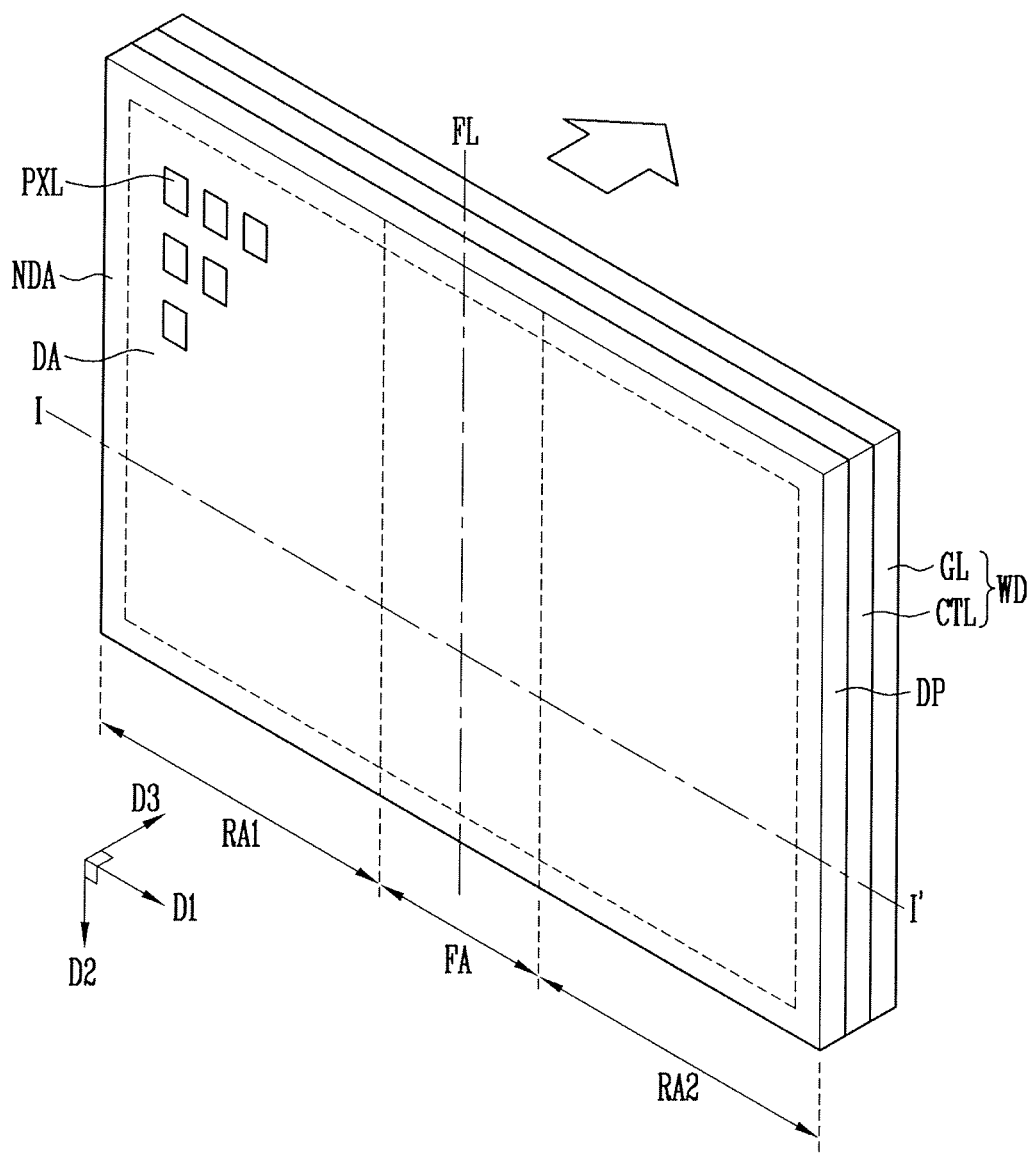
FIG. 8 is a perspective view illustrating a display device according to an exemplary embodiment of the present invention.
Figure 9A:
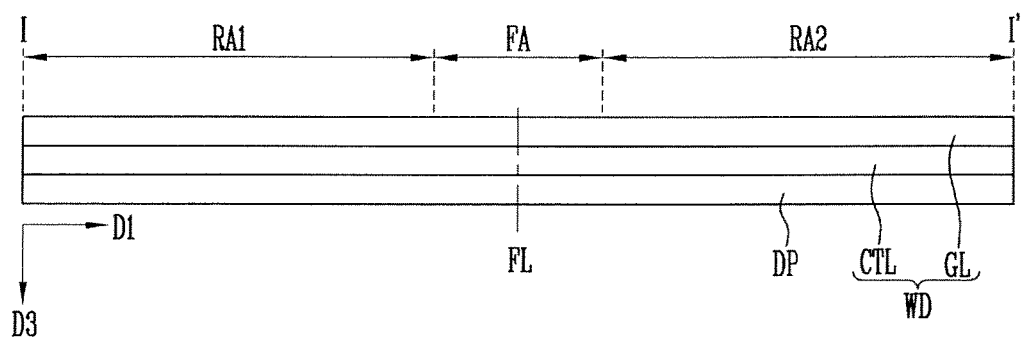
FIG. 9A is a sectional view taken along line I-I' of FIG. 1.
Figure 9B:
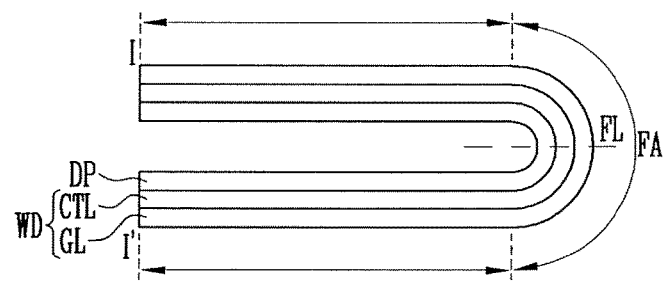
FIG. 9B is a sectional view illustrating a state in which the display device of FIG. 8 is folded.

FIG. 8 is a perspective view illustrating a display device according to an exemplary embodiment of the present invention. FIG. 9A is a sectional view taken along line I-I' of FIG. 1. FIG. 9B is a sectional view illustrating a state in which the display device of FIG. 8 is folded.

Referring to FIGS. 8, 9A, and 9B, the display device is foldable or bendable.

The display device may be provided in various shapes. For example, the display device may be provided in the shape of a rectangular plate having two pairs of sides parallel to each other. When the display device is provided in the shape of the rectangular plate, any pair of sides out of the two pairs of sides may be provided longer than the other pair of sides. In FIGS. 9, 9A and 9B a case where the display device is provided in a rectangular shape having a pair of long sides and a pair of short sides is illustrated for convenience of description. In addition, the long sides extend in the first direction D1, the short side extend in the second direction D2, and the third direction D3 is perpendicular to the first and second directions D1 and D2.

However, the shape of the display device is not limited thereto, and the display device may have various shapes. For example, the display device may have various shapes such as a closed-shape polygon including linear sides, a circle, an ellipse, etc., including curved sides, a semicircle, a semi-ellipse, etc., including linear and curved sides, or a combination thereof. In an exemplary embodiment of the present invention, when the display device has linear sides, one or more corners of the display device may be curved. For example, when the display device has a rectangular shape, an area where intersecting linear sides of the display device meet may be replaced with a curve having a predetermined curvature. In other words, a vertex portion of the rectangular display device may be rounded and may have a predetermined curvature. The curvature may be set or changed depending on the shape of the display device. For example, the curvature may be changed depending on a position at which the curve is started, a length of the curve, etc.

At least one portion of the display device may have flexibility, and the display device may be folded at the portion having the flexibility. For example, the display device may include a flexible area FA having a flexibility and in which the display device is foldable, and a rigid area RA provided on at least one side of the flexible area. The rigid area RA is an area of the display device in which the display device is not folded.

An area in which the display panel is not folded is referred to as the rigid area RA, but this is provided for convenience of description. The term "rigid" includes not only a case where the rigid area is hard without flexibility but also a case where the rigid area RA has flexibility, but the flexibility of the rigid area RA is smaller than the flexibility of the flexible area FA. In addition, the rigid area RA may also be flexible but not folded.

In an exemplary embodiment of the present invention, the entire display device may correspond to the flexible area FA. For example, in the case of a display device that is rolled, the entire display device may correspond to the flexible area FA.

In FIGS. 8, 9A and 9B, a case where a first rigid area RA1, a flexible area FA, a second rigid area RA2 are sequentially arranged along the first direction D1 has been disclosed as an example. The flexible area FA may extend along the second direction D2.

When assuming that the center line on which the display device is folded is a folding line FL, the folding line FL is provided in the flexible area FA. In FIGS. 8, 9A and 9B, it is illustrated that the folding line FL passes through the center of the flexible area FA, and the flexible area FA is symmetric with respect to the folding line FL, but the present invention is not limited thereto. For example, the folding line FL may be provided asymmetrically in the flexible area FA. The flexible area FA and the folding line FL on the flexible area FA may overlap with an area in which an image of a display panel DP is displayed. When the display device is folded, the area in which the image is displayed may be folded.

The term "folded" does not mean a fixed shape but means a shape deformable into another shape from the original shape, and includes a shape folded, bent, curved, or rolled along one or more specific lines, e.g., the folding line FL. Therefore, a state in which the surfaces of the two rigid areas RA are located in parallel to each other and folded to face each other has been illustrated in FIGS. 8, 9A and 9B. However, the present invention is not limited thereto, and the surfaces of the two rigid areas RA may be folded to form a predetermined angle (e.g., an acute angle, a right angle, or an obtuse angle) with the flexible area FA interposed therebetween.

In the display device of FIGS. 8, 9A and 9B, the folding line FL is provided in the flexible area FA, along the second direction D2, that is the extending direction of the flexible area FA. Accordingly, the display device can be folded in the flexible area FA.

In an exemplary embodiment of the present invention, when the display device is folded along the folding line FL, the display device may be folded such that portions of a surface opposite to a surface on which an image is displayed face each other. A window substrate WD may be exposed at the outermost side in the state in which the display device is folded. In this case, the image can be provided to the outside even in the state in which the display device is folded, and a user can view the image regardless of whether the display device is folded. However, the folding direction of the display device is not limited thereto. When the display device is folded along the folding line FL, the display device may be folded such that two portions of the surface on which the image is displayed face each other.

In FIGS. 8, 9A and 9B, for convenience of description, it is illustrated that the first and second rigid areas RA and RA2 have areas similar to each other, and the flexible area FA is located between the two rigid areas RA1 and RA2, but the present invention is not limited thereto. For example, the first and second rigid areas RA1 and RA2 may have areas different from each other. In addition, the number of rigid areas is not necessarily limited to two. For example, a display device may have one or three or more rigid areas. In this case, a plurality of rigid areas may be provided to be spaced apart from each other with a flexible area FA interposed therebetween.

The display device, according to an exemplary embodiment of the present invention, includes the display panel DP and the window substrate WD provided on a front surface of the display panel DP, the window substrate WD having a predetermined thickness.

The window substrate WD may include a glass substrate GL and a coating layer CTL.

The window substrate WD may be provided in a plate shape corresponding to the shape of the display panel DP, and covers at least one portion of the front surface of the display panel DP. For example, when the display panel DP is provided in a rectangular shape, the window substrate WD may also be provided in a rectangular shape corresponding to that of the display panel DP. Alternatively, when the display panel DP is provided in a circular shape, the window substrate WD may also be provided in a circular shape corresponding to that of the display panel DP.

The window substrate WD allows an image from the display panel DP to be transmitted therethrough and simultaneously reduces impact from the outside to prevent the display panel DP from being damaged or erroneously operated due to the impact from the outside. The impact from the outside refers to a force from the outside, for example, a foreign object including a pen, a hand or other object, which collides with the window substrate WD to cause stress to the window substrate WD and/or a defect to the display panel DP.

The window substrate WD, as described above, may have elasticity to absorb the impact from the outside and simultaneously distribute the impact from the outside to surroundings of the window substrate WD. For example, the window substrate WD may be deformed by impact from the outside, and may have elasticity that enables the window substrate WD to return to the original state after being impacted from the outside. In addition, the window substrate WD has an excellent impact resistance in which the window substrate WD is less deformed or damaged due to impact from the outside.

The window substrate WD reduces bending deformation of the display panel DP due to a point impact and compressive deformation and/or tensile deformation of the display panel DP due to a surface impact. For example, the window substrate WD reduces an impact applied to the display panel DP from the direction of the front surface of the display panel DP. The front surface of the display panel DP frequently comes in contact with a sharp tool such as a stylus pen. The impact of the front surface, caused by the tool, has a relatively narrow contact area with the display panel DP, and accordingly, corresponds to a point impact where a high pressure is applied to a narrow area of the display panel DP when the tool drops from the top. As a result, bending deformation occurs as the display panel DP is bent at the position at which the impact is applied. The bending deformation of the display panel DP may cause a bright spot failure of the display panel DP. However, in the display device, according to an exemplary embodiment of the present invention, the window substrate WD may prevent such a failure.

The entire or at least a portion of the window substrate WD may have flexibility. For example, the entire window substrate WD may be flexible. Alternatively, the window substrate WD may have flexibility in an area corresponding to the flexible area FA.

In an exemplary embodiment of the present invention, the window substrate WD may have different thicknesses, different repulsive forces, different impact resistance, and the like, in the flexible area FA and the rigid areas. When stress repetitively occurs in a specific area (e.g., the flexible area FA) at a room temperature, even though the entire window substrate WD may be flexible, the stress in the specific area may be higher than that in other areas of the window substrate WD. Therefore, the window substrate WD may be deformed to prevent damage from the stress.

For example, the thickness of the glass substrate GL or the coating layer CTL in the flexible area FA may be thinner than that of the glass substrate GL or the coating layer CTL at a portion except the flexible area FA. Alternatively, the compressive stress of the glass substrate GL in the flexible area FA may be greater than that of the glass substrate GL at a portion of the glass substrate GL excluding the flexible area FA. Accordingly, each index of the window substrate WD in the flexible area FA may be differently set.

The display panel DP may display visual information, e.g., a text, a video, a picture, a two-dimensional or three-dimensional image, etc. The kind of the display panel DP is not particularly limited as long as the display panel DP displays images.

The entire or at least a portion of the display panel DP may have flexibility. For example, the entire display panel DP may have flexibility. Alternatively, the display panel DP may have flexibility in an area corresponding to the flexible area FA.

The display panel DP may be provided in the shape of a plate having a front surface on which an image is displayed and a rear surface opposite to the front surface. The display panel DP displays an image on the front surface. In an exemplary embodiment, the display panel DP may display an image on both of the front and rear surface. However, in an exemplary embodiment of the present invention, a case where an image is displayed on the front surface is described as an example. In FIG. 8, the direction of the front surface on which an image is displayed has been indicated by a broad arrow.

The display panel DP includes a display area DA, in which the image is displayed, and a non-display area NDA, located on a border of the display area DA. For example, the non-display area NDA may be provided in a shape surrounding the display area DA.

The display area DA is an area in which a plurality of pixels PXL are provided to display an image.

The display area DA may be provided in a shape corresponding to that of the display device. For example, like the shape of the display device, the display area DA may be a closed-shape polygon including linear sides, a circle, an ellipse, etc., including curved sides, and/or a semicircle, a semi-ellipse, etc., including linear and curved sides. In an exemplary embodiment of the present invention, the display area DA may be provided in a rectangular shape.

The pixels PXL are provided on the display area DA. Each of the pixels PXL is a minimum unit for displaying an image, and may be provided in plurality. The pixels PXL may emit white light and/or color light. Each pixel PXL may emit light of red, green, or blue, but the present invention is not limited thereto. For example, each pixel PXL may emit light of a color such as cyan, magenta, or yellow.

The pixel PXL may be a light emitting device including an organic light emitting layer, but the present invention is not limited thereto. For example, the pixel may be implemented in various forms such as a liquid crystal device, an electrophoretic device, or an electrowetting device.

Figure 10:
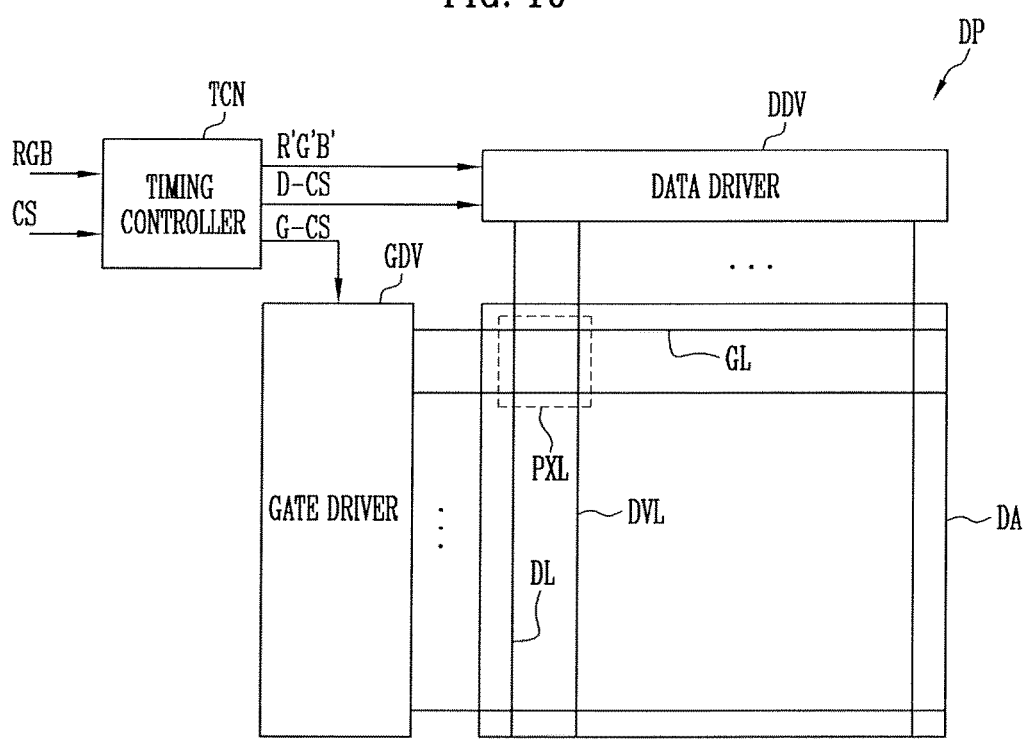
FIG. 10 is a block diagram illustrating a display panel according to an exemplary embodiment of the present invention.
Figure 11:
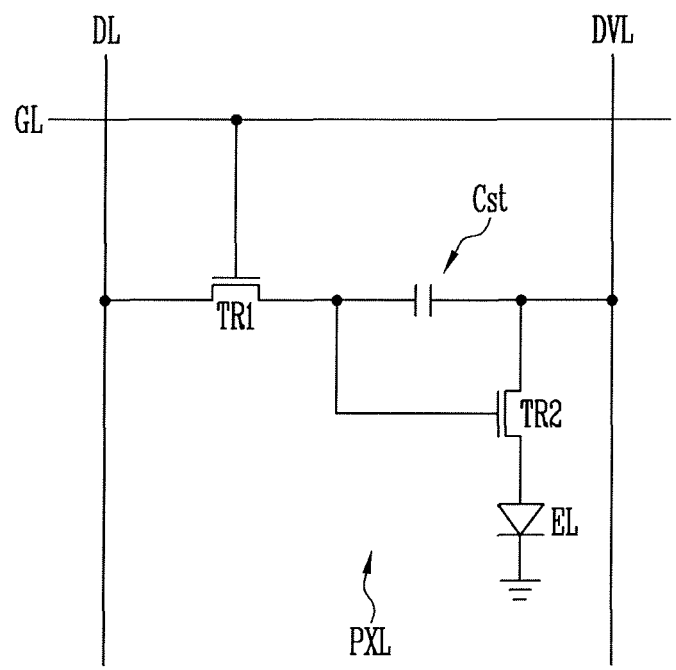
FIG. 11 is a circuit diagram of one pixel in FIG. 10 according to an exemplary embodiment of the present invention.

FIG. 10 is a block diagram illustrating a display panel according to an exemplary embodiment of the present invention. FIG. 11 is a circuit diagram of one pixel in FIG. 10 according to an exemplary embodiment of the present invention.

Referring to FIGS. 10 and 11, a display panel DP includes pixels PXL provided on a display area DA, gate and data drivers GDV and DDV for driving the pixels PXL, and a timing controller TCN for controlling the driving of the gate and data drivers GDV and DDV.

Each pixel PXL is provided on the display area DA, and includes a line unit including a gate line GL, a data line DL, and a driving voltage line DVL, a thin film transistor connected to the line unit, an organic light emitting device EL connected to the thin film transistor, and a capacitor Cst.

The gate line GL extends in a direction. The data line DL extends in another direction intersecting the gate line GL. The driving voltage line DVL extends in the substantially same direction as the data line DL. The gate line GL transmits a gate signal to the thin film transistor. The data line DL transmits a data signal to the thin film transistor. The driving voltage line DVL provides a driving voltage to the thin film transistor.

The thin film transistor may include a driving thin film transistor TR2 for controlling the organic light emitting device EL and a switching thin film transistor TR1 for switching the driving thin film transistor TR2. In FIG. 11, it is illustrated that one pixel PXL includes two thin film transistors TR1 and TR2. However, the present invention is not limited thereto, and the one pixel PXL may include one thin film transistor and one capacitor, or may include three or more thin film transistors and two or more capacitors.

A gate electrode of the switching thin film transistor TR1 is connected to the gate line GL, and a source electrode of the switching thin film transistor TR1 is connected to the data line DL. A drain electrode of the switching thin film transistor TR1 is connected to a gate electrode of the driving thin film transistor TR2. The switching thin film transistor TR1 transmits, to the driving thin film transistor TR2, a data signal applied to the data line DL, in response to a gate signal applied to the gate line GL.

The gate electrode of the driving thin film transistor TR2 is connected to the drain electrode of the switching thin film transistor TR1, and a source electrode of the driving thin film transistor TR2 is connected to the driving voltage line DVL. A drain electrode of the driving thin film transistor TR2 is connected to the organic light emitting device EL.

The organic light emitting device EL includes a light emitting layer, and a first electrode and a second electrode, which are opposite to each other with the light emitting layer interposed therebetween. The first electrode is connected to the drain electrode of the driving thin film transistor TR2. A common voltage is applied to the second electrode, and the light emitting layer emits light according to an output signal of the driving thin film transistor TR2, so that light is emitted or is not emitted, thereby displaying an image. The light emitted from the light emitting layer may be white light or colored light.

The capacitor Cst may be connected between the gate electrode and the source electrode of the driving thin film transistor TR2. The capacitor Cst charges and maintains a data signal input to the gate electrode of the driving thin film transistor TR2.

The timing controller TCN receives a plurality of image signals RGB and a plurality of control signals CS from another circuit of the display device. The timing controller TCN converts data formats of the image signals RGB to be suitable for interface specifications with the data driver DDV, and provides the converted image signals R'G'B' to the data driver DDV. In addition, the timing controller TCN generates a data control signal D-CS (e.g., an output start signal, a horizontal start signal, etc.) and a gate control signal G-CS (e.g., a vertical start signal, a vertical clock signal, vertical clock bar signal, etc.), based on the plurality of control signals CS. The data control signal D-CS is provided to the data driver DDV, and the gate control signal G-CS is provided to the gate driver GDV.

The gate driver GDV sequentially outputs a gate signal in response to the gate control signal G-CS, provided from the timing controller TCN. Thus, the plurality of pixels PXL can be sequentially scanned in unit of rows by the gate signal.

The data driver DDV converts the image signals R'G'B' into data signals and outputs the converted data signals, in response to the data control signal D-CS provided from the timing controller TCN. The output data signals are applied to the pixels PXL.

Thus, each pixel PXL is turned on by the gate signal, and the turned-on pixel PXL receives a corresponding data voltage from the data driver DDV to display an image having a desired gray level.

Figure 12:
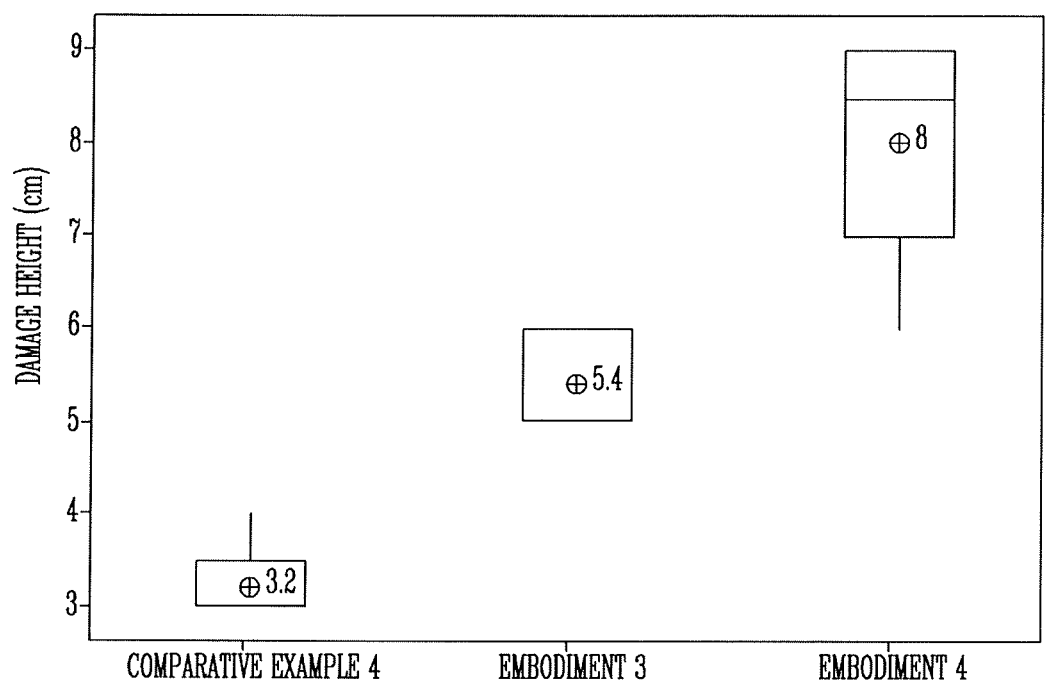
FIG. 12 is a graph illustrating impact resistance of a display device according to a related art and a display device according to an exemplary embodiment of the present invention.

FIG. 12 is a graph illustrating impact resistance of a display device according to a related art and a display device according to an exemplary embodiment of the present invention.

Comparative Example 4 represents an impact resistance of a display device according to the related art, and Embodiments 3 and 4 represent an impact resistance of a display device according to exemplary embodiments of the present invention. In FIG. 12, each display device used an organic light emitting display module as a display panel. In addition, the organic light emitting display module was adhered to a window substrate using an adhesive, and all conditions except the window substrate were identically maintained.

The adhesive is used to attach the window substrate to the display panel. The adhesive is located under the window substrate to attach the display panel and the window substrate as a single body and simultaneously distribute stress generated in the display panel and the window substrate at a room temperature. To prevent separation between the window substrate and the display panel, the adhesive requires a predetermined adhesion magnitude, a predetermined elastic modulus, and a predetermined creep under the condition of a room temperature of 25° C. and a humidity of 50%. Hence, the adhesion of the adhesive may be a minimum of 500 gf/in, the storage modulus of the adhesive may be a maximum of 100 MPa, and the creep of the adhesive may be 50% to 800%. In Comparative Example 4, the related art glass substrate was used as the window substrate. In Embodiment 3, a glass substrate GL having increased impact resistance (i.e., a glass substrate in which the mole ratio of $Al_2O_3/Na_2O$ is equal to or smaller than 1) was used as the window substrate WD. In Embodiment 4, a coating layer CTL, provided in addition to the glass substrate GL having increased impact resistance, was used in the window substrate WD. An impact resistance was evaluated in such a manner that measured a height at which damage occurred by allowing a specific pen (Fine BIC pen produced by Societe BIC) having a weight of about 5.8 g, which is covered with a lid, to freely drop on the window substrate WD in a state in which the specific pen is perpendicular to the surface of the window substrate WD.

Referring to FIG. 12, damage of the substrate occurred at a height of 3.2 cm in Comparative Example 4. However, damage of the substrate occurred at a height of 5.4 cm in Embodiment 3, and damage of the substrate occurred at a height of 8 cm in Embodiment 4. Accordingly, the impact resistance in the display device according to the exemplary embodiments of the present invention is increased with respect to that of the Comparative Example 4.

A display device is not limited to the above-described form. In addition, various functional layers may be added to the display device in addition to the display panel and the window substrate, and the display device may be modified in various other forms. In the evaluation of the impact resistance of the display device shown in FIG. 12, it was determined that the non-damage height of the specific pen was about 5 cm or more. However, the display device shown in FIG. 12 corresponds to a case where only the display device having no separate buffer member in addition to the display panel and the window substrate is evaluated. When the display device is applied to an actual display device, the display device may be included in a case including a display panel and a buffer member, to help absorb impact, etc.

Therefore, the evaluation of the impact resistance of the display device may be changed depending on the kind of display panel, whether the buffer member is provided, a change in shape of the display device, and the like. In addition, the non-damage height of the specific pen in a display device, according to an exemplary embodiment of the present invention, may be equal to or greater than about 3 cm.

Figure 13A:
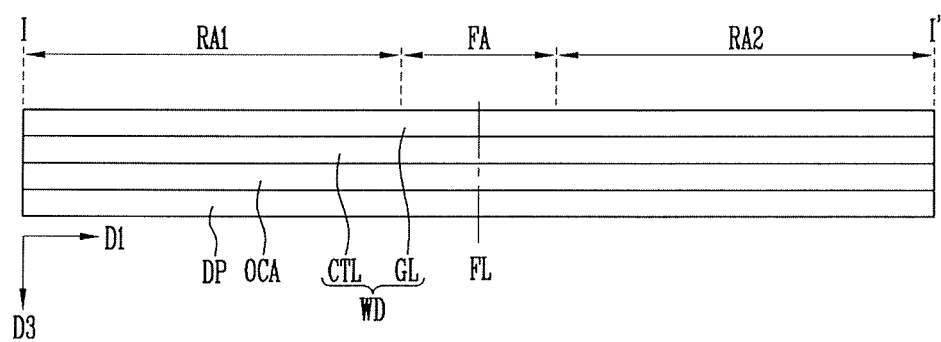
FIGS. 13A to 13C are sectional views illustrating display devices according to embodiments of the present invention.
Figure 13B:
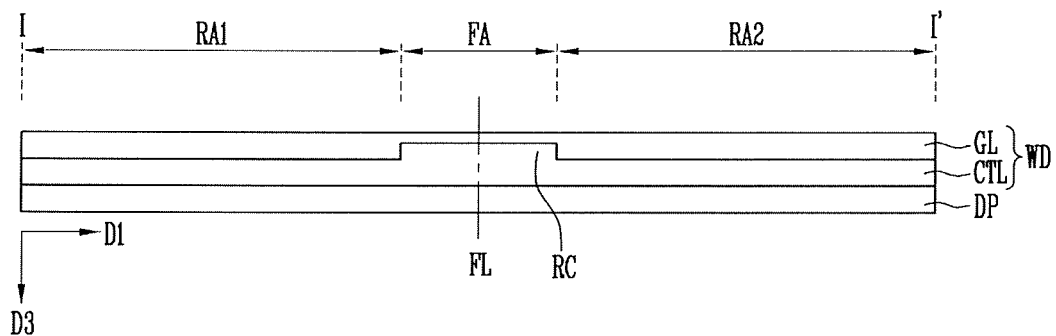
Figure 13C:
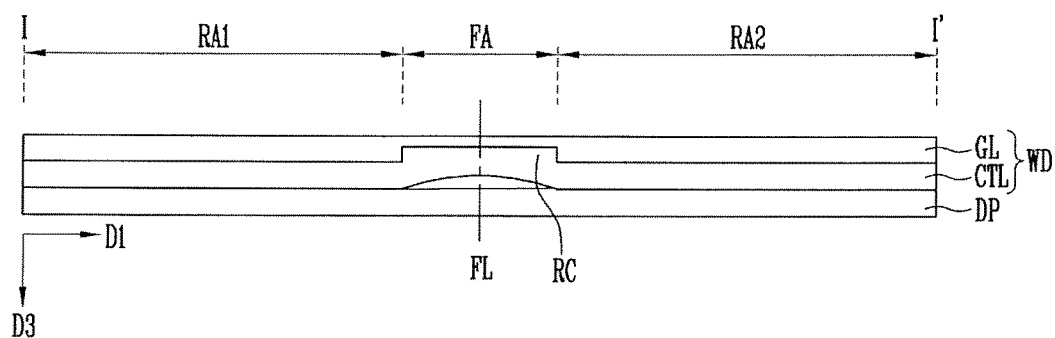

FIGS. 13A to 13C are sectional views illustrating display devices according to embodiments of the present invention.

Referring to FIG. 13A, a display device according to an embodiment of the present invention may include a display panel DP, a window substrate WD, and an adhesive OCA provided between the display panel DP and the window substrate WD to adhere the window substrate WD to the display panel. The adhesive OCA may be an optically transparent adhesive.

In an exemplary embodiment of the present invention, the adhesion of the adhesive may be a minimum of 500 gf/in, the storage modulus of the adhesive may be a maximum of 100 MPa, and the creep of the adhesive may be 50% to 800%.

The adhesive is located directly under the window substrate WD to attach the display panel DP and the window substrate WD as a single body and simultaneously distribute stress generated in the display panel DP and the window substrate WD at a room temperature. In an exemplary embodiment of the present invention, the Young's modulus of the window substrate WD may be high, and separation between the window substrate WD and the display panel DP may occur when material properties of the adhesive OCA are not properly selected. To avoid the separation between window substrate WD and the display panel DP, the adhesive OCA is required which has a high adhesion property, a high creep, and a low storage modulus under the condition of a room temperature of 25° C. and a humidity of 50%.

The creep is measured using thermochemical analysis (TMA), and a measuring method is as follows. After a force of 3 N is applied to an adhesive sample, an initial deformation is measured. Then, after the force of 3 N is maintained for 120 minutes, a final deformation is measured. Therefore, the ratio of the deformation is calculated as shown in the following Expression 4.

$$\text{Creep} = \frac{\text{Final deformation} - \text{Initial deformation}}{\text{Initial deformation}}. \quad \text{Expression 4}$$

The adhesive OCA may have a material property changed depending on its thickness, and the thickness for excluding a change in material property may range from 10 μm to 200 μm.

In FIG. 13A, it has been illustrated that the display panel DP is disposed directly under the window substrate WD with the adhesive OCA interposed therebetween, but the present invention is not limited thereto. The display device may further include various other components between the window substrate WD and the display panel DP or another position. For example, a touch sensor may be further included between the window substrate WD and the display panel DP, or a polarizing plate, and the like, may be further included between the window substrate WD and the display panel DP. Alternatively, an impact reducing layer for improving impact resistance may be interposed between the window substrate WD and the display panel DP, and a functional layer for controlling a neutral surface may be interposed between the window substrate WD and the display panel DP to increase the folding reliability of the entire display device. Therefore, in an exemplary embodiment of the present invention, another adhesive or adhesive layer for attaching the additional components to each other may be further added.

FIGS. 13B and 13C are sectional views of display devices employing the window substrates WD shown in FIGS. 7E and 7F. Referring to FIGS. 13B and 13C, a recess RC of a glass substrate GL in the window substrate WD may be provided corresponding to a flexible area FA in the display device. By considering a direction in which the glass substrate GL is to be folded or rolled, the recess RC may be provided in a region corresponding to the direction of folding or rolling. For example, the recess RC may be provided in the flexible area in which the display device can be folded, bent, or rolled. When the recess RC is provided in the entire area or a partial area on the glass substrate GL, the thickness of the glass substrate GL in the area in which the recess RC is provided is decreased, and hence the tensile stress generated in the glass substrate GL is decreased. As a result, the display device can be easily bent or rolled.

In each of the display devices, according to the exemplary embodiments of the present invention, the display area is not divided, and it may be provided as one area. However, the present invention is not limited thereto, and the display area may be provided in plurality.

Figure 14:
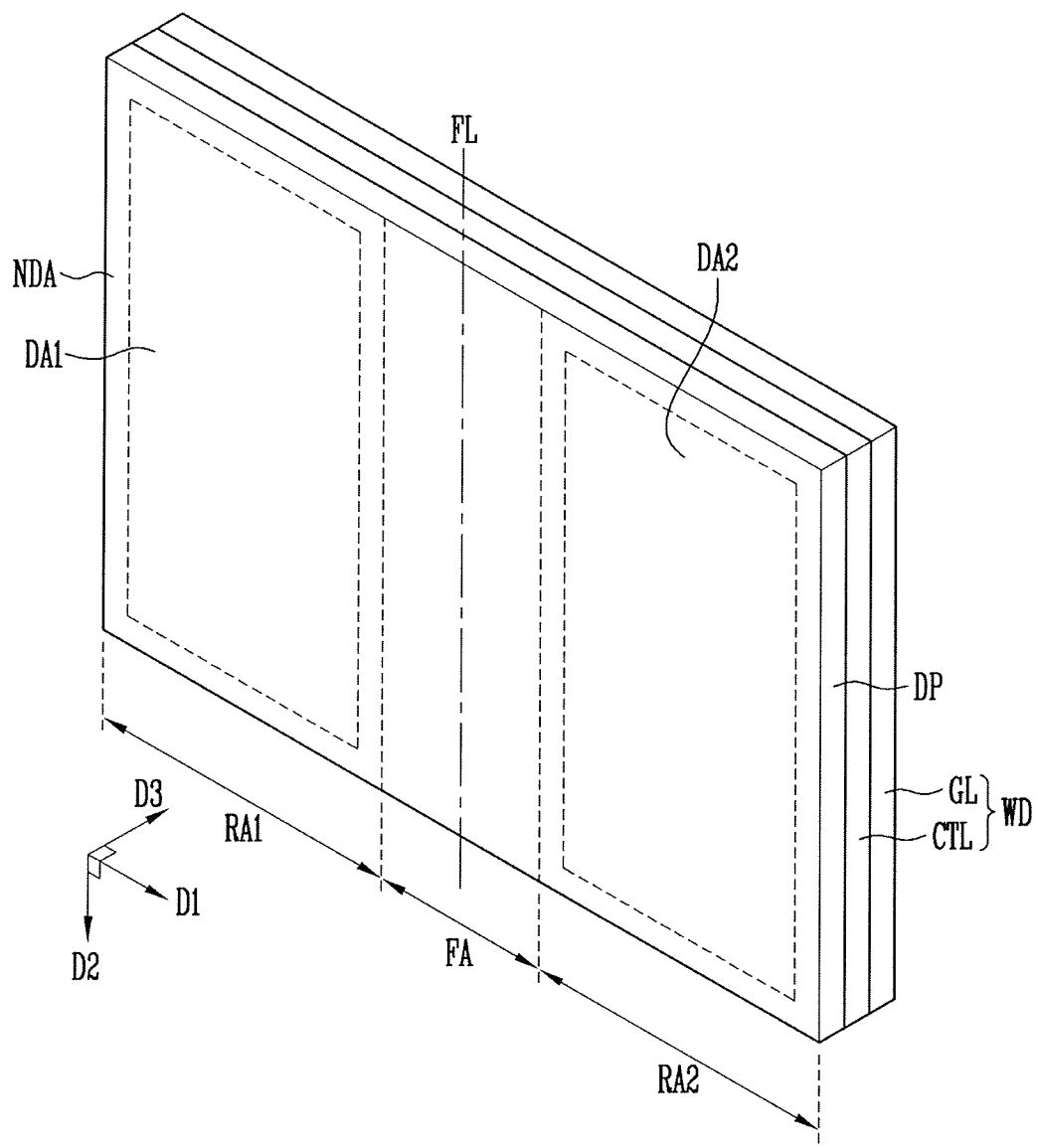
FIG. 14 is a perspective view illustrating a display device including two display areas, according to an exemplary embodiment of the present invention.

FIG. 14 is a perspective view illustrating a display device including two display areas, according to an exemplary embodiment of the present invention.

Referring to FIG. 14, the display device may include a plurality of display areas. For example, the display device may include a first display area DA1 and a second display area DA2. A non-display area NDA may be provided at the circumference of the first display area DA1 and the second display area DA2. The first display area DA1 and the second display area DA2 may be spaced apart from each other with the non-display area NDA interposed therebetween. When viewed on a plane, a display panel DP may include a first rigid area RA1, a second rigid area RA2, and a flexible area FA disposed between the first rigid area RA1 and the second rigid area RA2. The flexible area FA may overlap with the non-display area NDA between the first display area DA1 and the second display area DA2.

A folding line FL may be provided parallel to any one side of the display device. However, the present invention is not limited thereto, and the folding line FL may be disposed in various directions regardless of the shape of the display device. For example, in an exemplary embodiment of the present invention, the folding line FL may be provided oblique to any one side of the display device.

Figure 15:
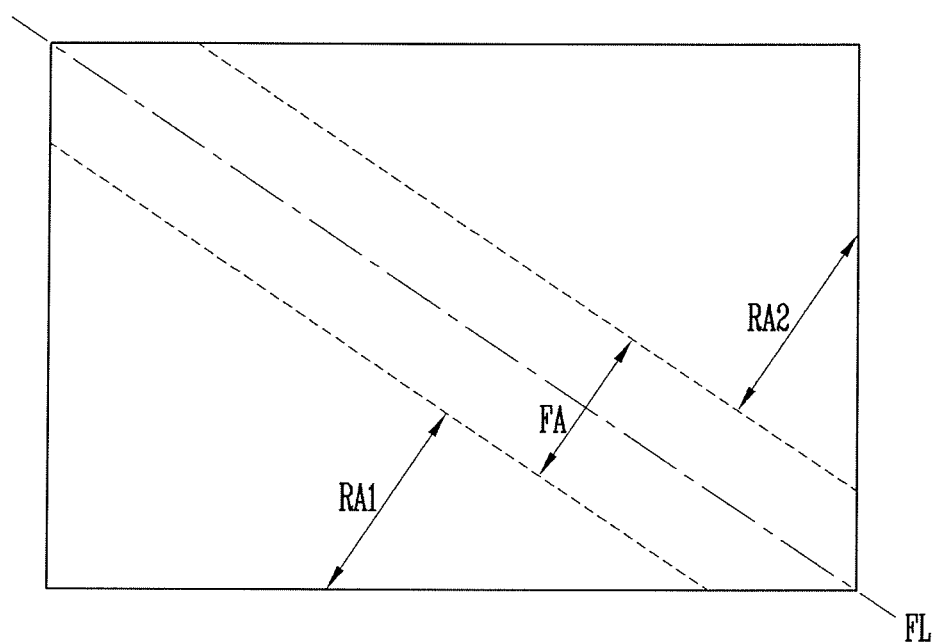
FIG. 15 is a plan view illustrating rigid areas, a flexible area, and a folding line of a display device according to an exemplary embodiment of the present invention.

FIG. 15 is a plan view illustrating rigid areas, a flexible area, and a folding line of a display device according to an exemplary embodiment of the present invention.

Referring to FIG. 15, the display device is provided in a rectangular shape, and a folding line FL is provided along a diagonal line of the rectangular shape. In the display device of FIG. 15, a flexible area FA is also provided in a diagonal direction along the folding line FL, and a first rigid area RA1 and a second rigid area RA2 may be provided at both sides of the flexible area FA, respectively.

In an exemplary embodiment of the present invention, a single folding line may be provided. However, the present invention is not limited thereto, and the folding line FL may be provided in plurality.

Figure 16A:
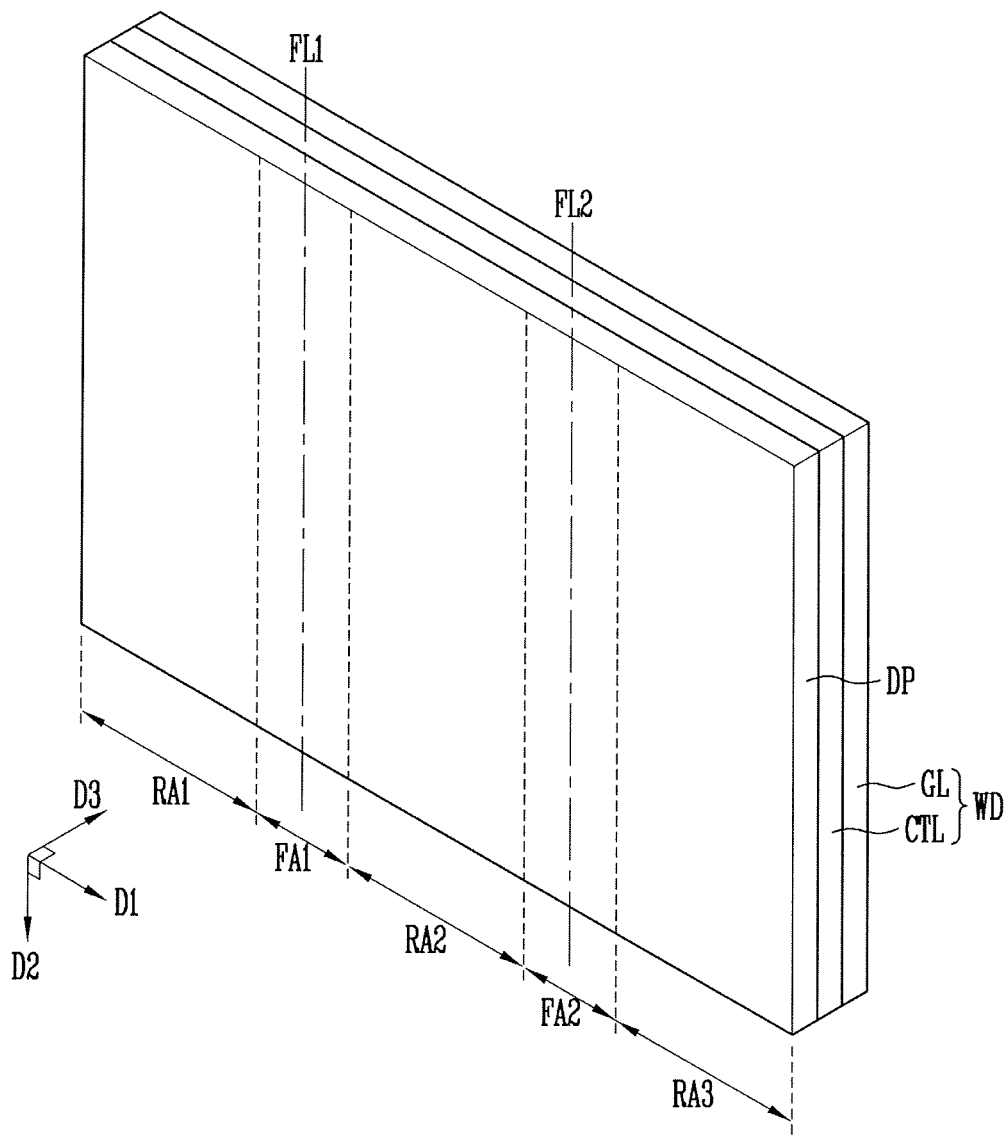
FIG. 16A is a perspective view illustrating a display device according to an exemplary embodiment of the present invention.
Figure 16B:
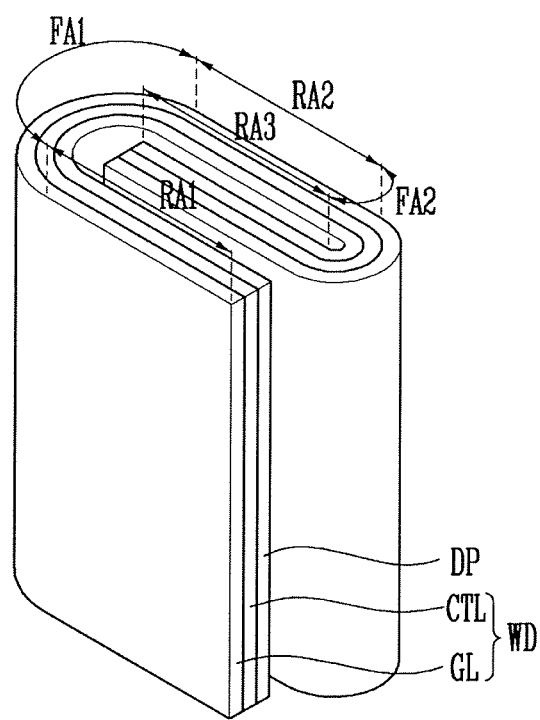
FIG. 16B is a perspective view illustrating a state in which the display device of FIG. 16A is folded, according to an exemplary embodiment of the present invention.

FIG. 16A is a perspective view illustrating a display device according to an exemplary embodiment of the present invention. FIG. 16B is a perspective view illustrating a state in which the display device of FIG. 16A is folded, according to an exemplary embodiment of the present invention.

Referring to FIGS. 16A and 16B, a plurality of folding lines are provided. Therefore, the display device may have a plurality of flexible areas and a plurality of rigid areas. In the display device of FIGS. 16A and 16B, it has been described as an example that two folding lines, e.g., a first folding line FL and a second folding line FL2 are provided, and correspondingly, a first rigid area RA1, a first flexible area FA1, a second rigid area RA2, a second flexible area FA2, and a third rigid area RA3 are sequentially disposed in a first direction D1. The first flexible area FA and the second flexible area FA2 may extend in a second direction D2 corresponding to the first folding line FL1 and the second folding line FL2, respectively.

As shown in FIG. 16B, the display device may be folded in the first flexible area FA1 and the second flexible area FA2. In FIG. 16B, it has been illustrated that the display device is folded such that the third rigid area RA3 is located between the first rigid area RA1 and the second rigid area RA2, but the present invention is not limited thereto. In an exemplary embodiment of the present invention, the display device may be folded such that the second rigid area RA2 is located between the first rigid area RA1 and the third rigid area RA3.

In FIG. 16B, it has been illustrated that both of the first folding line FL1 and the second folding line FL2 extend in the second direction D2. However, the extending direction of the first folding line FL1 and the second folding line FL2 is not limited thereto, and the first folding line FL1 and the second folding line FL2 may extend in directions different from each other. For example, the first folding line FL1 may extend in the first direction D1, and the second folding line FL2 may extend in the second direction D2. Alternatively, both of the first folding line FL1 and the second folding line FL2 extend in the first direction D1. Alternatively, the first folding line FL1 may extend in the first direction D1, and the second folding line FL2 may extend in a direction oblique to the first folding line FL1. In an exemplary embodiment of the present invention, the folding lines may extend in different directions even when three or more folding lines are provided.

In an exemplary embodiment of the present invention, a flexible area may be provided at an outermost side of the display device in a direction such that a portion of the display device is rolled.

Figure 17A:
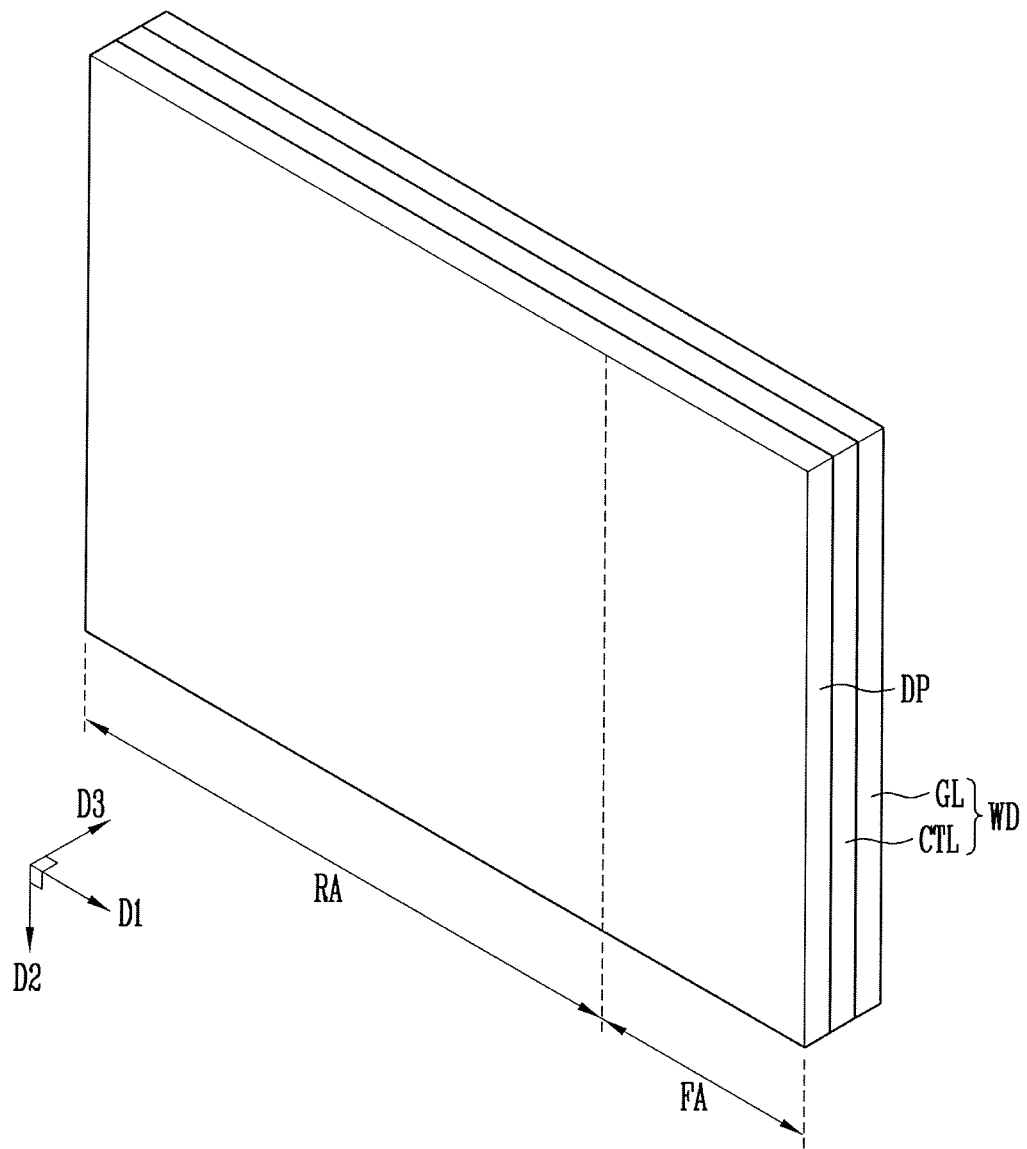
FIG. 17A is a perspective view illustrating a display device according to an exemplary embodiment of the present invention.
Figure 17B:
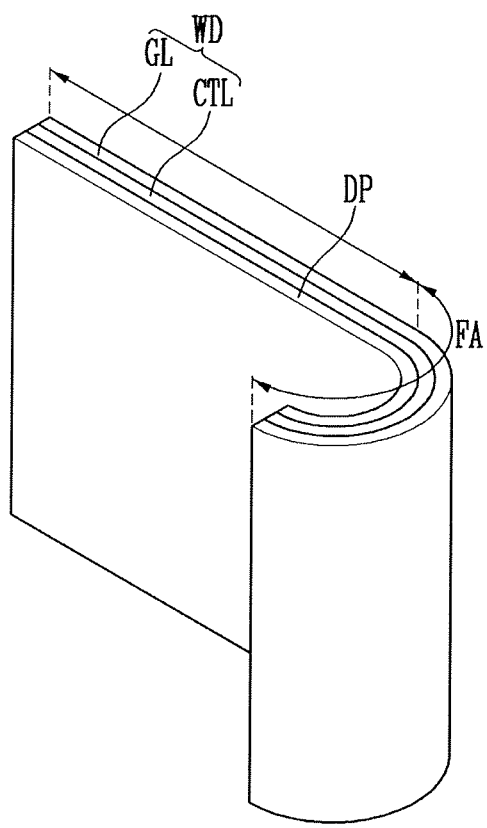
FIG. 17B is a perspective view illustrating a state in which the display device of FIG. 17A is rolled according to an embodiment of the present invention.

FIG. 17A is a perspective view illustrating a display device according to an exemplary embodiment of the present invention. FIG. 17B is a perspective view illustrating a state in which the display device of FIG. 17A is rolled according to an embodiment of the present invention.

Referring to FIGS. 17A and 17B, the display device has a display panel DP and a window substrate WD including a glass substrate GL and a coating layer CTL. The diplay panel DP and the window substrate WD has a rigid area RA and a flexible area FA. The flexible area FA may be provided at one side of the rigid area RA. The flexible area FA may be provided at an outermost side of the display device in a first direction D1. The display device may be rolled in the flexible area FA. In some embodiments, in the flexible area FA, the glass substrate GL may include a first region extending from a first surface or a second surface of the glass substrate GL to a first depth inside the glass substrate GL, and the rigid area RA, the glass substrate GL may include a second region extending from a first surface or a second surface of the glass substrate GL to second depth inside the glass substrate GL. The first region may have a first compressive stress and a first depth, and the second region may have a second compressive stress and a second depth different from the first compressive stress and the first depth.

The window substrate and the display device having the same according to the embodiment of the present invention may be employed in various electronic devices. For example, the display device may be applied to televisions, notebook computers, cellular phones, smart phones, smart pads, portable music players (PMPs), personal digital assistants (PDAs), navigation systems/devices, various wearable devices such as smart watches, etc.

According to an exemplary embodiment of the present invention, a window substrate may be durable and may have an increased safety level by providing a high tolerance degree against physical impacts. In addition, a display device may include the window substrate.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A window substrate, comprising:
    a plurality of glass substrates each including first and second surfaces opposite to each other, each of the glass substrates having a thickness of about 25 μm to about 100 μm;
    a coating layer disposed on the first surface of each of the plurality of glass substrates, wherein each of the plurality of glass substrates includes $SiO_2$, $Al_2O_3$ and $Na_2O$, and a mole ratio of $Al_2O_3/Na_2O$ is equal to or smaller than 1; and
    an optically transparent adhesive disposed between adjacent glass substrates of the plurality of glass substrates.

2. The window substrate of claim 1, wherein the coating layer has a thickness equal to or smaller than about 50 μm.

3. The window substrate of claim 2, wherein the coating layer has an elastic modulus of about 10 GPa or less.

4. The window substrate of claim 3, wherein the coating layer includes at least one of urethane resin, epoxy resin, polyester resin, polyether resin, acrylate resin, acrylonitrile-butadiene-styrene (ABS) resin, or rubber.

5. The window substrate of claim 2, wherein a difference between a first repulsive force against deformation of each of the plurality of glass substrates and a second repulsive force against deformation of each of the plurality of glass substrates together with the coating layer is 50% or less of the first repulsive force.

6. The window substrate of claim 1, wherein, in each of the plurality of glass substrates, the mole ratio of the $Al_2O_3/Na_2O$ is equal to 1.0 or 0.33.

7. The window substrate of claim 1, further comprising a plurality of coating layers, wherein each of the plurality of coating layers is disposed on a respective glass substrate of the plurality of glass substrates.

8. The window substrate of claim 1, wherein each of the plurality of glass substrates has a recess in the first surface or the second surface.

9. The window substrate of claim 8, wherein the recess is filled by the coating layer.

10. The window substrate of claim 1, wherein the coating layer includes a protrusion protruding from a first surface of the coating layer, opposite to a second surface of the coating layer, wherein the second surface of the coating layer is disposed adjacent to each of the plurality of glass substrates.

11. The window substrate of claim 1, wherein the $Al_2O_3$ is contained at about 1 mol % to about 10 mol %, the $Na_2O$ is contained at about 10 mol % to about 20 mol %, and the $SiO_2$ is contained at about 55 mol % to about 70 mol %.

12. The window substrate of claim 1, wherein each of the plurality of glass substrates includes a first region extending from the first surface to a first depth inside the glass substrate, the first region having a first compressive stress.

13. The window substrate of claim 12, wherein the first depth is equal to or greater than 1 μm, and the first compressive stress is about 600 MPa to about 1200 MPa.

14. The window substrate of claim 13, wherein each of the plurality of glass substrates further includes a second region extending from the second surface of the glass substrates, wherein the second region has a second compressive stress, wherein the first and second depths are different from each other and the first and second compressive stresses are different from each other.

15. The window substrate of claim 1, wherein the window substrate has a transmittance of 90% or more.

16. The window substrate of claim 1, wherein, the window substrate has a repulsive force of about 10 N or less in a deformation of the window substrate.

17. The window substrate of claim 1, wherein a yellow index variation of the window substrate is equal to or smaller than 1.0 when the window substrate is exposed to ultraviolet B (UVB) light, having a wavelength of 280 nm to 360 nm, for 72 hours.

18. The window substrate of claim 1, further comprising a cover layer disposed on the second surface of the glass substrates.

19. The window substrate of claim 18, wherein the cover layer is an anti-reflection layer, an anti-stain layer, or an anti-fingerprint layer.

20. The window substrate of claim 1, wherein at least a portion of the window substrate has flexibility.

21. A display device, comprising:
a display panel displaying an image on a first surface thereof; and
a window substrate disposed on the first surface of the display panel,
wherein the window substrate includes:
a glass substrate including first and second surfaces opposite to each other, the glass substrate having a thickness of about 25 μm to about 100 μm; and
a coating layer disposed on the first surface of the glass substrate,
wherein the coating layer has a thickness equal to or smaller than about 50 μm, and the coating layer is disposed between the glass substrate and the display panel,
wherein the glass substrate includes $SiO_2$, $Al_2O_3$ and $Na_2O$, and the mole ratio of $Al_2O_3/Na_2O$ is equal to 1 or 0.33.

22. The display device of claim 21, wherein the coating layer has a thickness equal to or smaller than about 10 μm.

23. The display device of claim 21, wherein, in the glass substrate, the mole ratio of the $Al_2O_3/Na_2O$ is equal to or smaller than 0.5.

24. The display device of claim 21, wherein the coating layer includes at least one of urethane resin, epoxy resin, polyester resin, polyether resin, acrylate resin, acrylonitrile-butadiene-styrene (ABS) resin, or rubber.

25. The display device of claim 21, further comprising a plurality of glass substrates.

26. The display device of claim 21, further comprising an optically transparent adhesive disposed between the display panel and the window substrate.

27. The display device of claim 26, wherein the optically transparent adhesive has an adhesion of about 500 gf/in or more, a storage modulus of about 100 MPa or less, and a creep of about 50% to about 800%.

28. The display device of claim 21, further comprising a cover layer disposed on the second surface of the glass substrate.

29. The display device of claim 28, wherein the cover layer is an anti-reflection layer, an anti-stain layer, or an anti-fingerprint layer.

30. A display device, comprising:
a display panel displaying an image on a first surface thereof; and
a window substrate disposed on the first surface of the display panel,
wherein the window substrate includes:
a glass substrate including first and second surfaces opposite to each other, the glass substrate having a thickness of about 25 μm to about 100 μm; and
a coating layer disposed on the first surface of the glass substrate,
wherein the coating layer has a thickness equal to or smaller than about 50 μm, and the coating layer is disposed between the glass substrate and the display panel,
wherein the glass substrate includes $SiO_2$, $Al_2O_3$ and $Na_2O$, and the mole ratio of $Al_2O_3/Na_2O$ is equal to or smaller than 1,
wherein the display panel and the window substrate include a first area having flexibility and a second area adjacent to the first area.

31. The display device of claim 30, wherein the glass substrate has different thicknesses in the first area and the second area.

32. The display device of claim 30, wherein the glass substrate has a recess in the first surface or the second surface.

33. The display device of claim 32, wherein the recess is disposed in the first area.

34. The display device of claim 30, wherein, in the first area, the glass substrate includes a first region extending from the first surface or the second surface of the glass substrate to a first depth inside the glass substrate, and in the second area, the glass substrate includes a second region extending from the first surface or the second surface of the glass substrate to a second depth inside the glass substrate, wherein the first region has a first compressive stress and a first depth, and the second region has a second compressive stress and a second depth different from the first compressive stress and the first depth.

35. A display device, comprising:
a display panel having a first surface for display of an image;
a flexible glass substrate having a thickness of about 25 μm to about 100 μm and disposed on the first surface of the display panel, the flexible glass substrate having a first reinforced surface and a second reinforced surface opposite to the first reinforced surface, the first reinforced surface overlapping the first surface of the display panel; and
a coating layer disposed between the display panel and the flexible glass substrate,
wherein the flexible glass substrate and the coating layers each have a composition such that the flexible glass substrate has a reaction against bending of 1 unit force, and the flexible glass substrate and the coating layer, when directly disposed on one another, have a reaction against bending greater than 1 unit of force and smaller than or equal to 1.5 units of force.

36. The display device of claim 35, wherein the flexible glass substrate includes $SiO_2$, $Al_2O_3$ and $Na_2O$, and the mole ratio of $Al_2O_3/Na_2O$ is equal to or smaller than 1.

37. The display device of claim 35, wherein the coating layer has a thickness equal to or smaller than about 40 μm.

* * * * *